United States Patent
Sandstrom et al.

(10) Patent No.: US 10,857,732 B2
(45) Date of Patent: Dec. 8, 2020

(54) RECURRING PROCESS FOR LASER INDUCED FORWARD TRANSFER AND HIGH THROUGHPUT AND RECYCLING OF DONOR MATERIAL BY THE REUSE OF A PLURALITY OF TARGET SUBSTRATE PLATES OR FORWARD TRANSFER OF A PATTERN OF DISCRETE DONOR DOTS

(71) Applicant: Mycronic AB, Taby (SE)

(72) Inventors: Torbjorn Sandstrom, Pixbo (SE); Gustaf Martensson, Gothenburg (SE); Mats Rosling, Taby (SE)

(73) Assignee: Mycronic AB, Taby (SE)

(*) Notice: Subject to any disclaimer, the term of this patent is extended or adjusted under 35 U.S.C. 154(b) by 626 days.

(21) Appl. No.: 15/548,752

(22) PCT Filed: Feb. 4, 2016

(86) PCT No.: PCT/EP2016/052430
§ 371 (c)(1),
(2) Date: Aug. 3, 2017

(87) PCT Pub. No.: WO2016/124712
PCT Pub. Date: Aug. 11, 2016

(65) Prior Publication Data
US 2018/0015671 A1 Jan. 18, 2018

Related U.S. Application Data

(60) Provisional application No. 62/112,628, filed on Feb. 5, 2015.

(51) Int. Cl.
*B23K 26/342* (2014.01)
*B29C 64/268* (2017.01)
(Continued)

(52) U.S. Cl.
CPC .......... *B29C 64/268* (2017.08); *B23K 26/062* (2015.10); *B23K 26/342* (2015.10);
(Continued)

(58) Field of Classification Search
CPC ..... B29C 64/268; B29C 64/273; B29C 64/10; B23K 26/062; B23K 26/342;
(Continued)

(56) References Cited

U.S. PATENT DOCUMENTS

| 2010/0129617 A1* | 5/2010 | Corrigan ................ G03F 1/20 428/195.1 |
| 2011/0097550 A1* | 4/2011 | Matusovsky ...... B23K 26/0738 428/167 |
| 2014/0160452 A1* | 6/2014 | De Jager ............ G03F 7/70375 355/53 |

OTHER PUBLICATIONS

PCT/EP2016/052430—Internatioanl Search Report and Written Opinion, dated May 8, 2016, 19 pages.
(Continued)

*Primary Examiner* — Joseph S Del Sole
*Assistant Examiner* — Lawrence D. Hohenbrink, Jr.
(74) *Attorney, Agent, or Firm* — Haynes Beffel & Wolfeld, LLP; Ernest J. Beffel, Jr.

(57) ABSTRACT

The technology disclosed relates to high utilization of donor material in a writing process using Laser-Induced Forward Transfer. Specifically, the technology relates to reusing, or recycling, unused donor material by recoating target substrates with donor material after a writing process is performed with the target substrate. Further, the technology relates to target substrates including a pattern of discrete separated dots to be individually ejected from the target substrate using LIFT.

19 Claims, 29 Drawing Sheets

(51) Int. Cl.
  *C23C 14/28* (2006.01)
  *C23C 14/56* (2006.01)
  *C23C 14/24* (2006.01)
  *C23C 14/04* (2006.01)
  *B33Y 10/00* (2015.01)
  *B33Y 30/00* (2015.01)
  *B23K 26/062* (2014.01)
  *B29C 64/10* (2017.01)

(52) U.S. Cl.
  CPC .............. *B29C 64/10* (2017.08); *B33Y 10/00* (2014.12); *B33Y 30/00* (2014.12); *C23C 14/048* (2013.01); *C23C 14/246* (2013.01); *C23C 14/28* (2013.01); *C23C 14/56* (2013.01)

(58) Field of Classification Search
  CPC .............. B23K 26/066; B23K 26/0738; B23K 26/352; B23K 26/0821; C23C 14/246; C23C 14/28; C23C 14/56; G03F 7/70375; G03F 7/70383; B33Y 10/00; B33Y 30/00; H05K 2203/107; H05K 3/0026; H05K 3/207; H05K 3/0097
  USPC ........................................................ 264/482
  See application file for complete search history.

(56) References Cited

OTHER PUBLICATIONS

Seung Hwan Ko et al: "Unconventional, Laser Based OLEO Material Direct Patterning and Transfer Method" In: "Organic Light Emitting Diode—Material, Process and Devices", Jul. 27, 2011, 21 pages.

\* cited by examiner

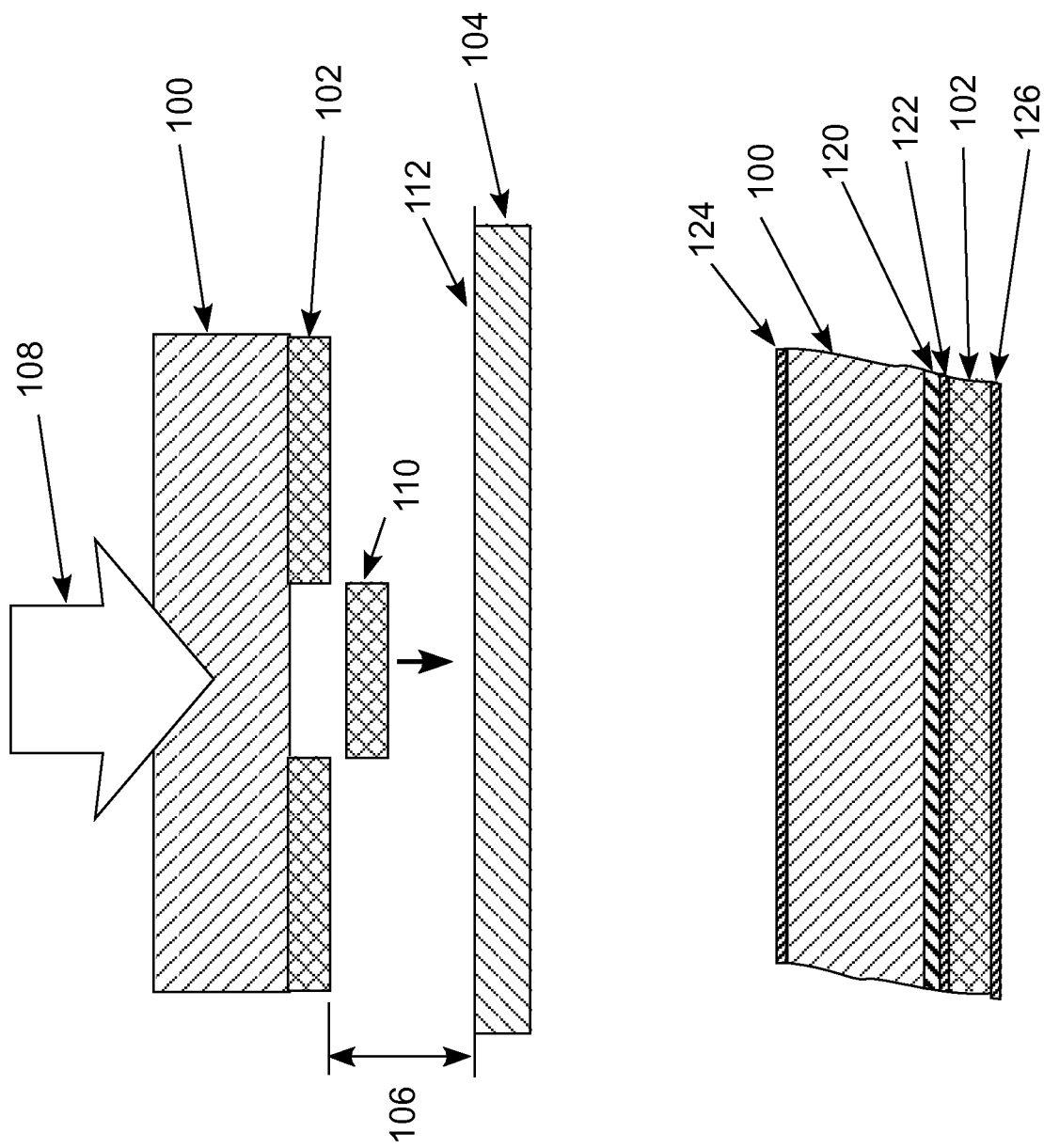

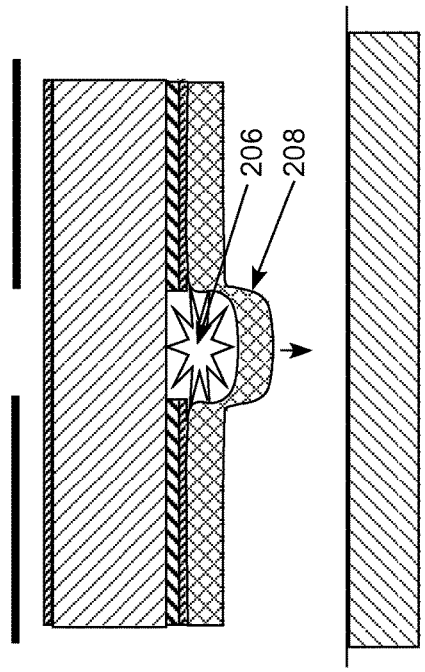
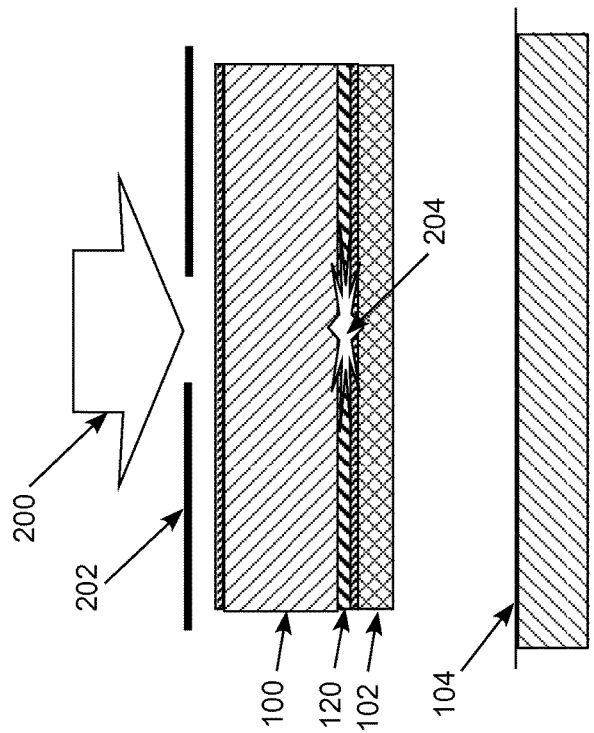
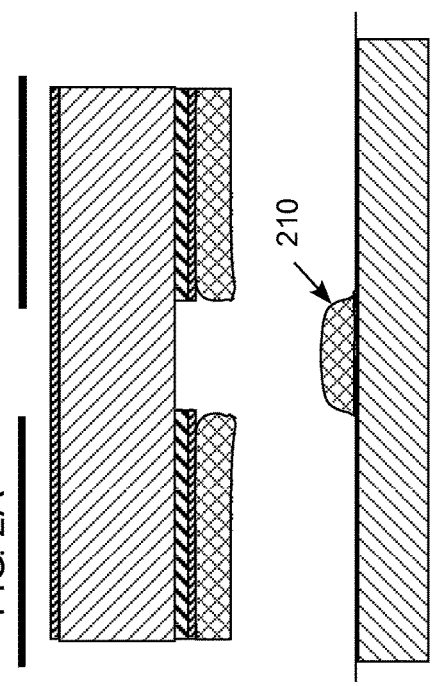
FIG. 2A
FIG. 2B
FIG. 2C

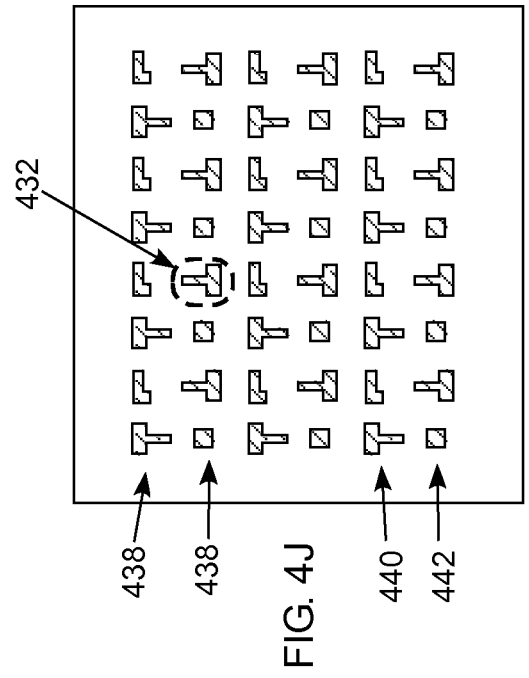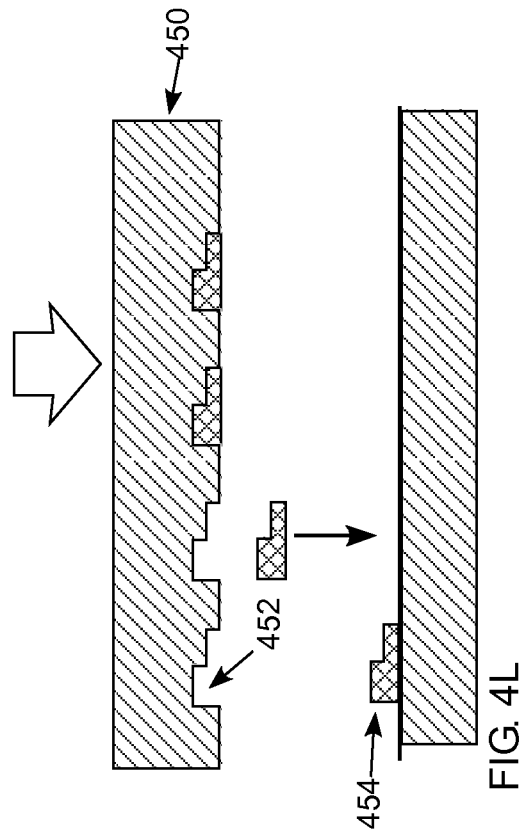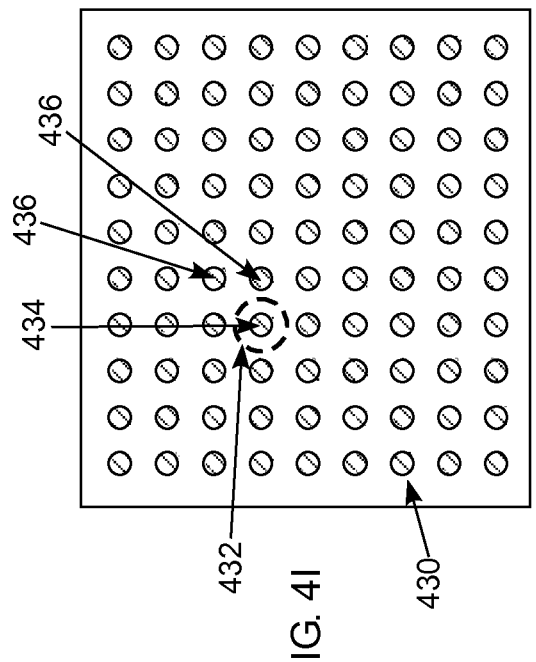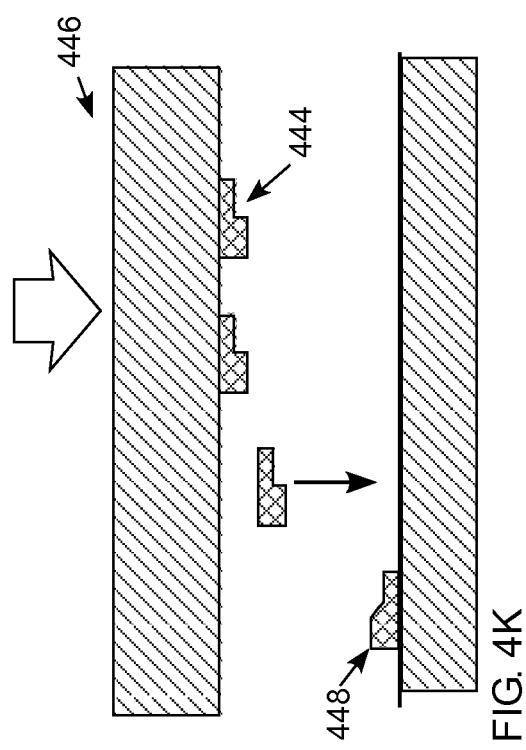

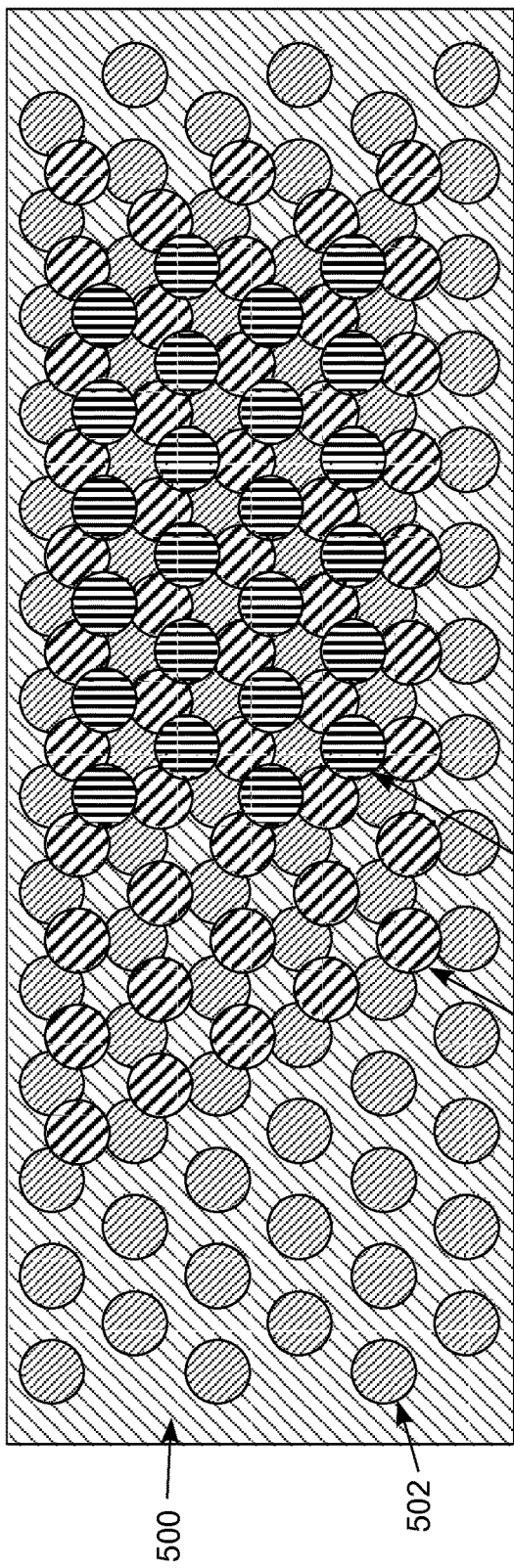
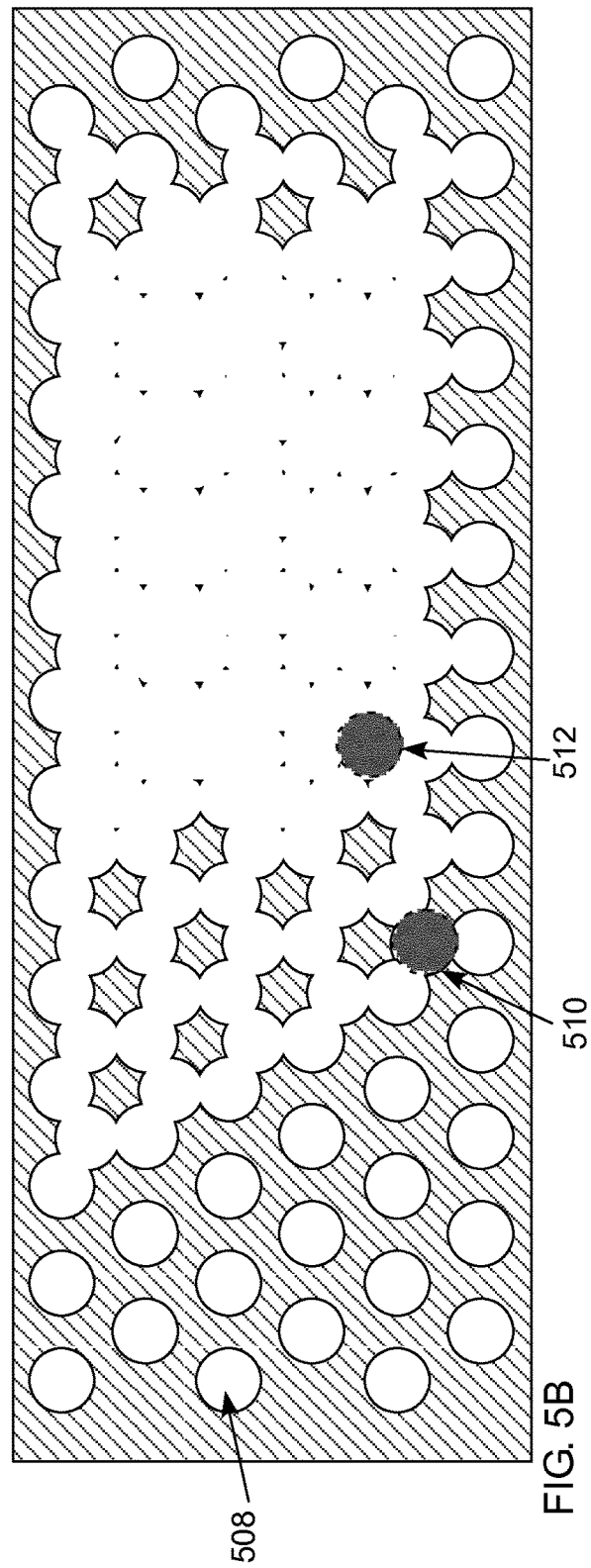
FIG. 5A
FIG. 5B

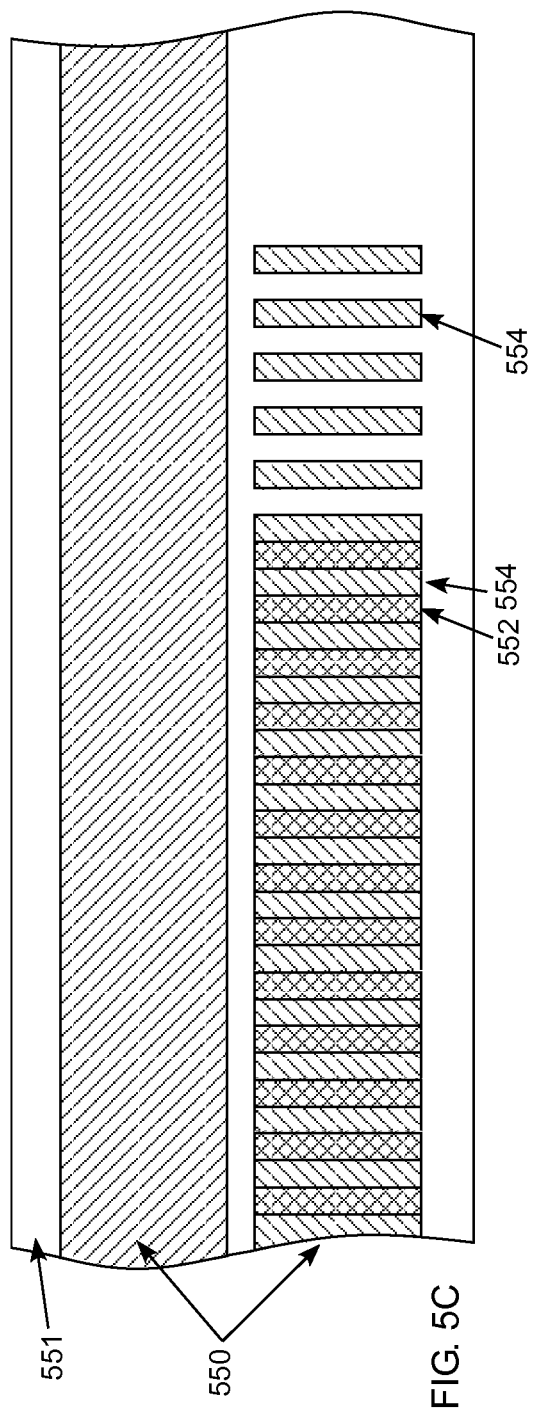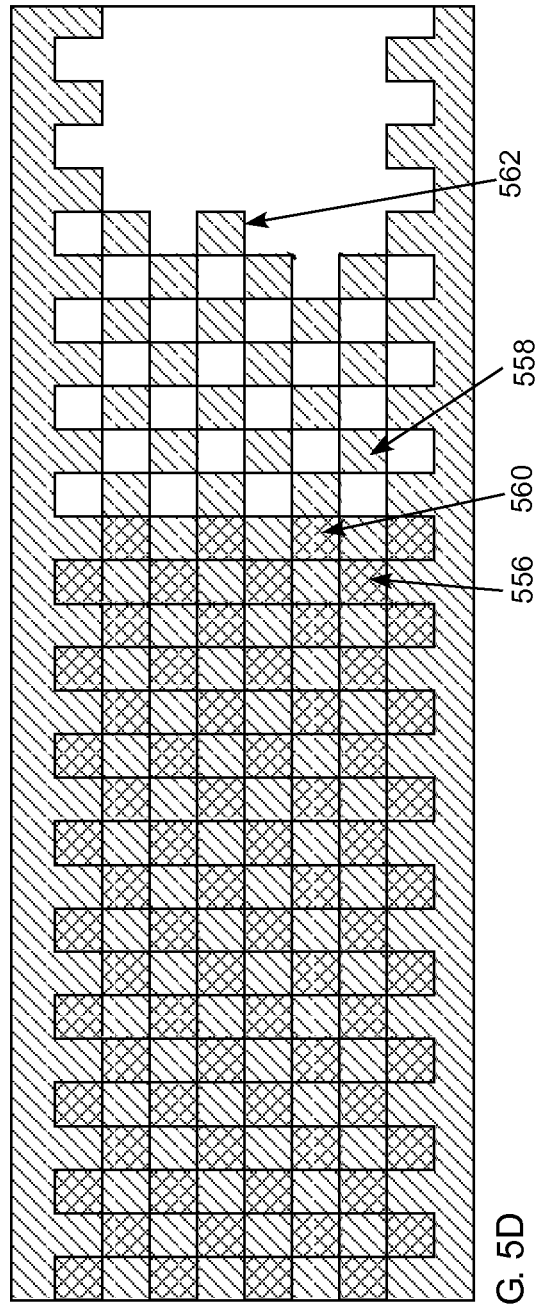

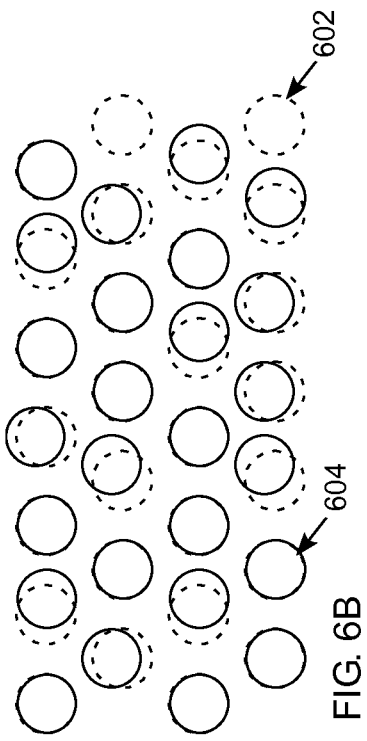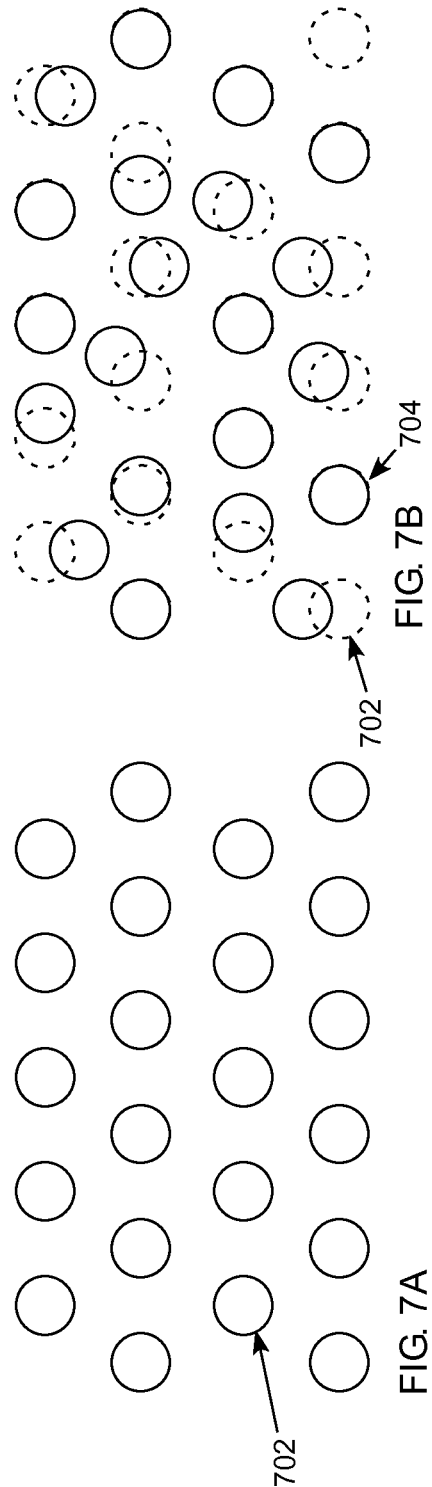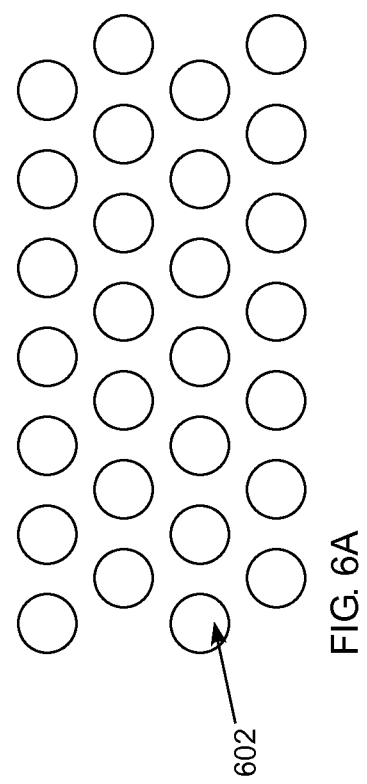

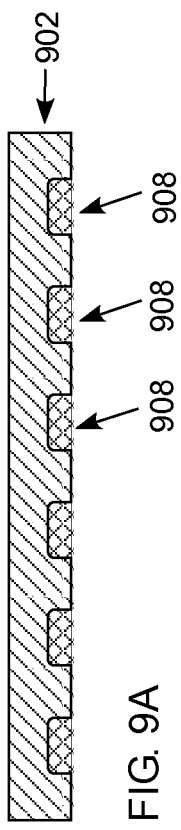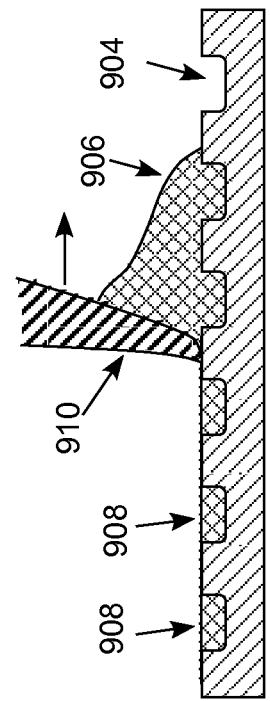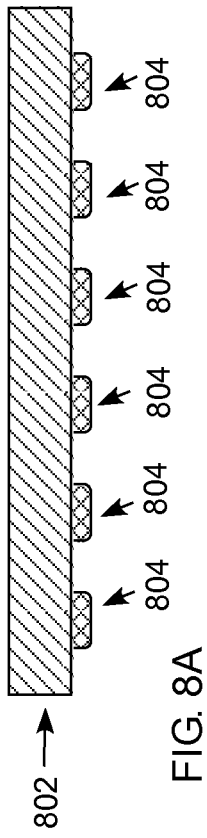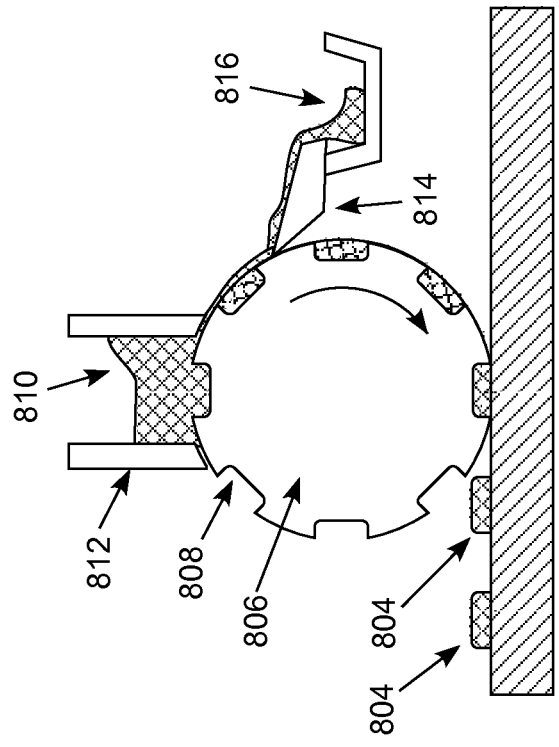

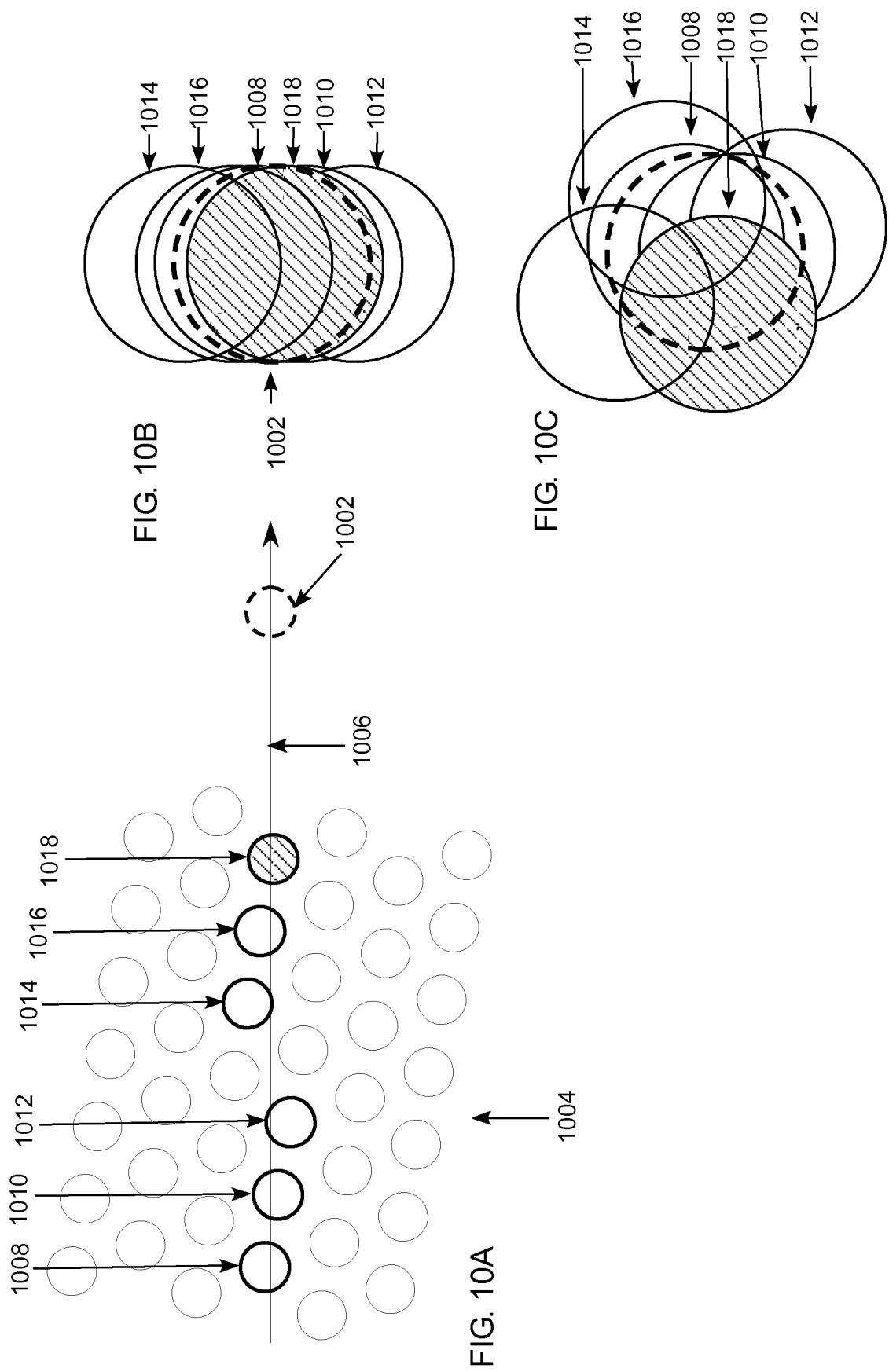

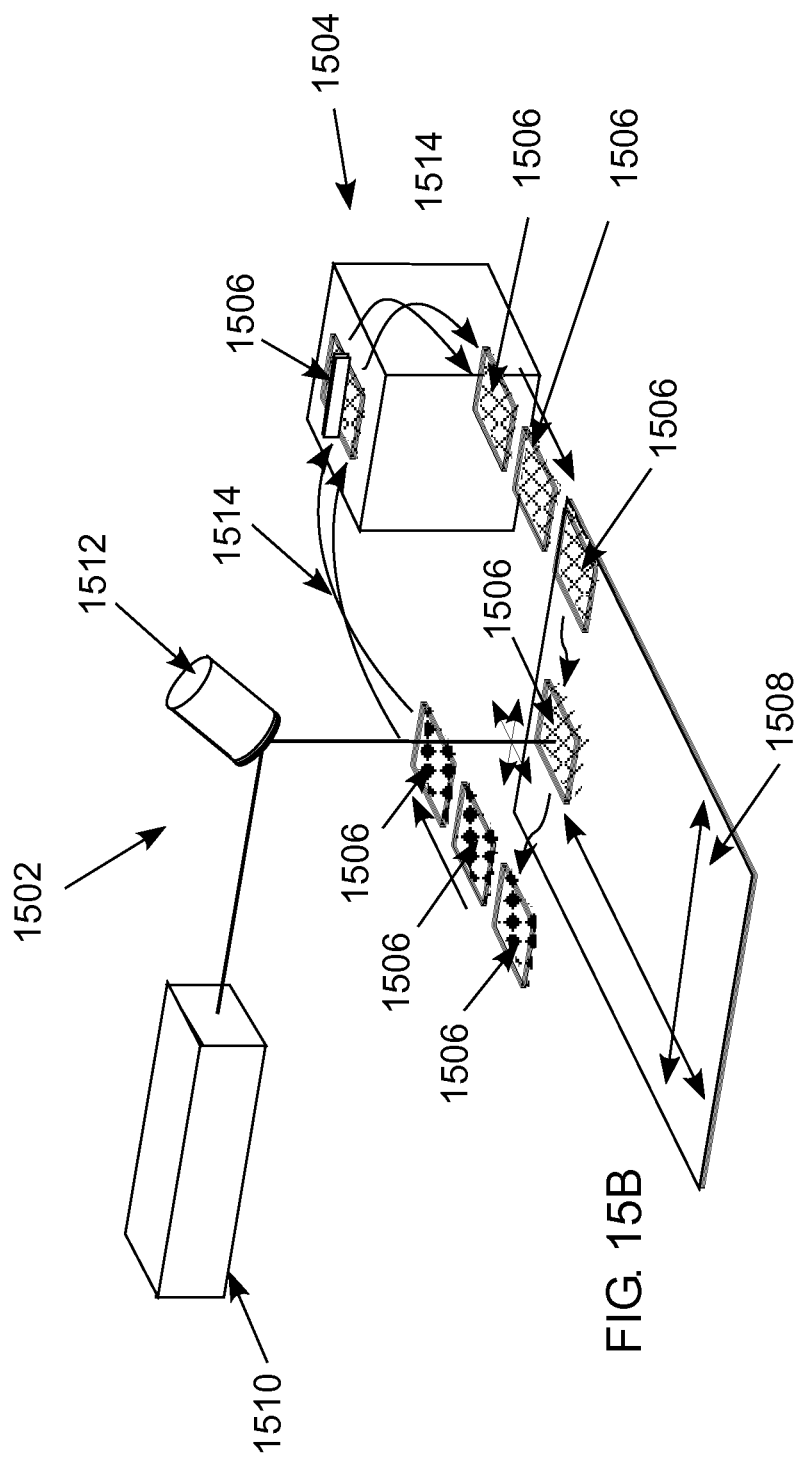

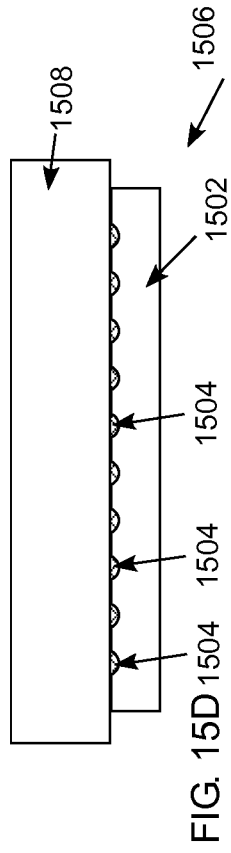
FIG. 15C
FIG. 15D
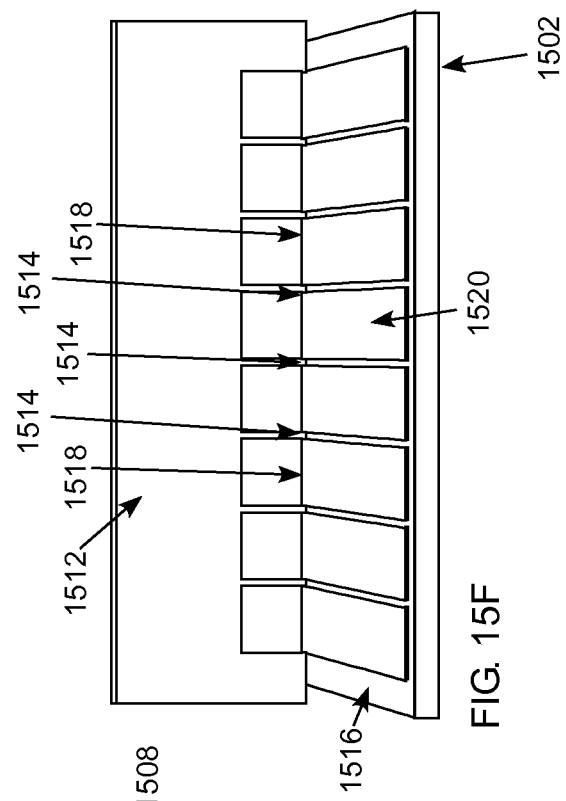
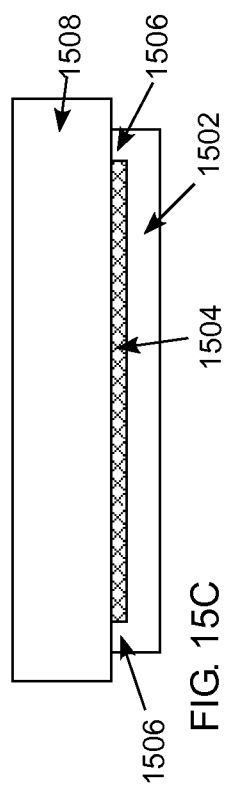
FIG. 15E
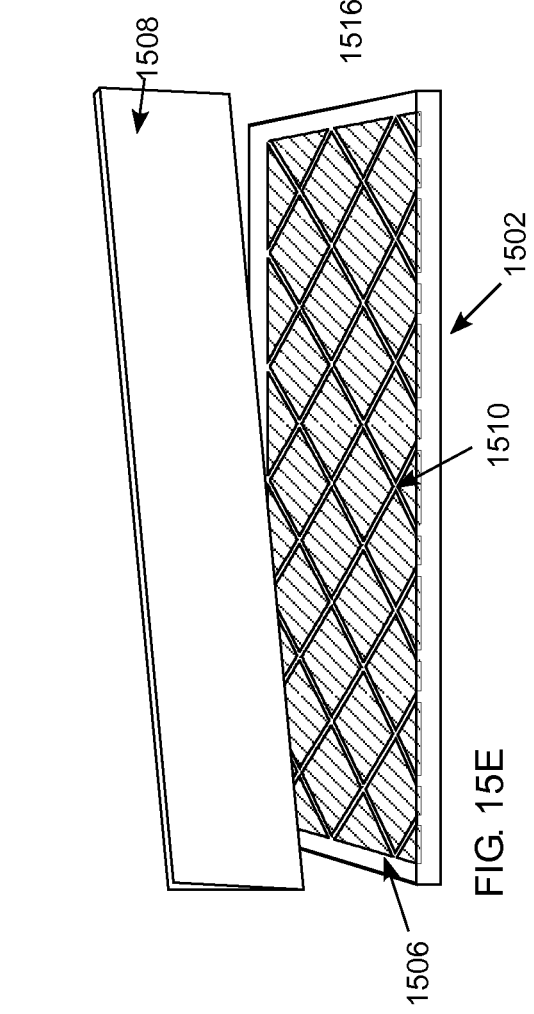
FIG. 15F

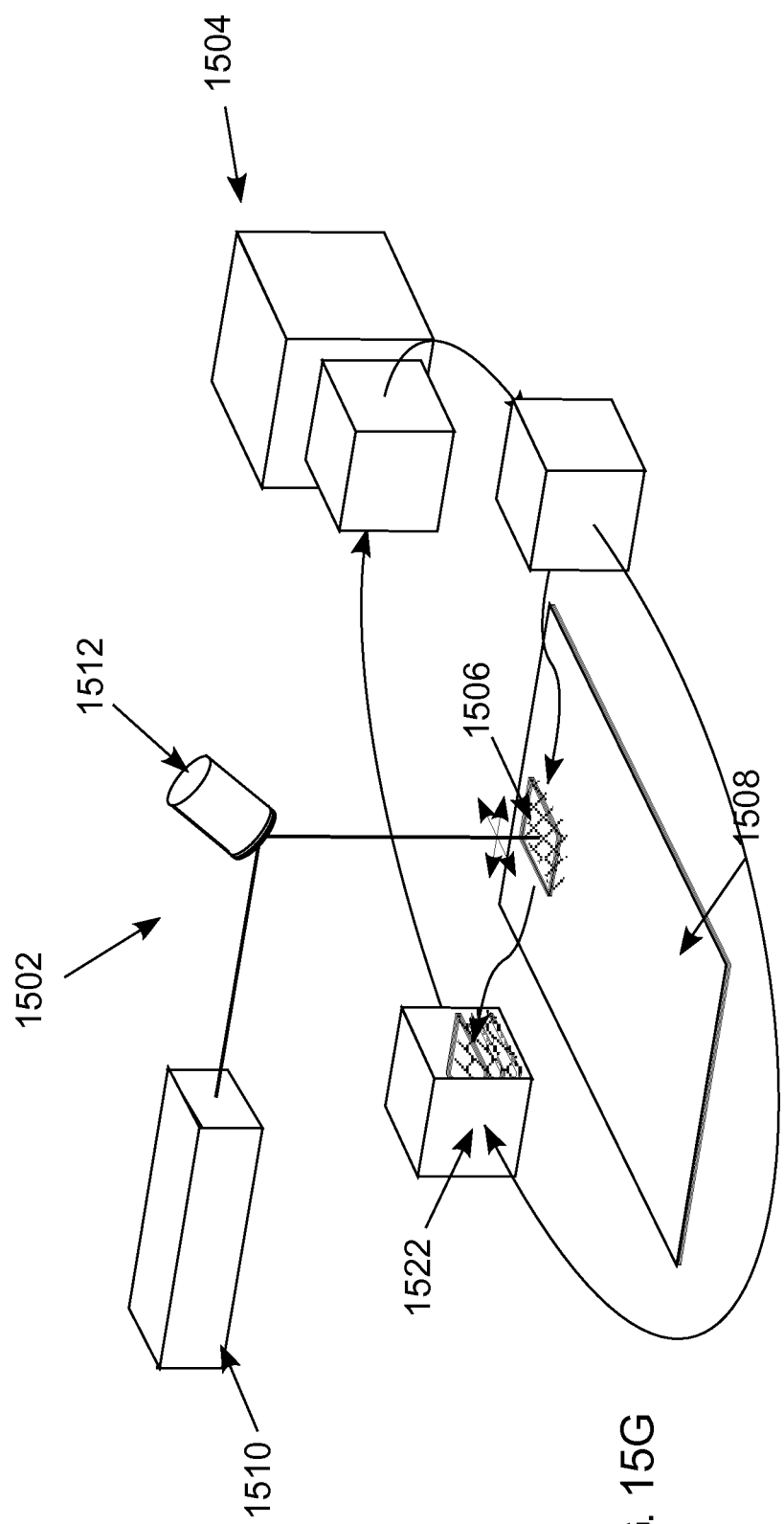

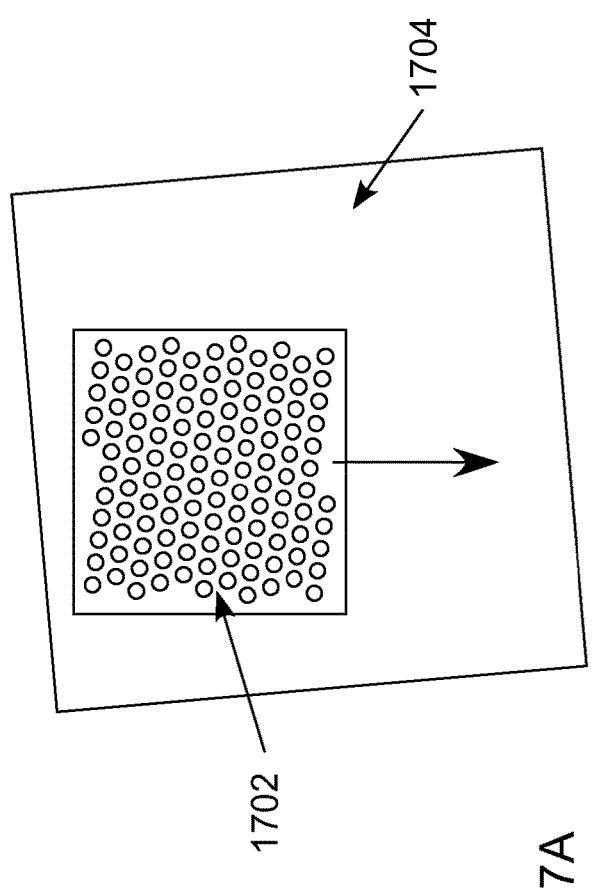
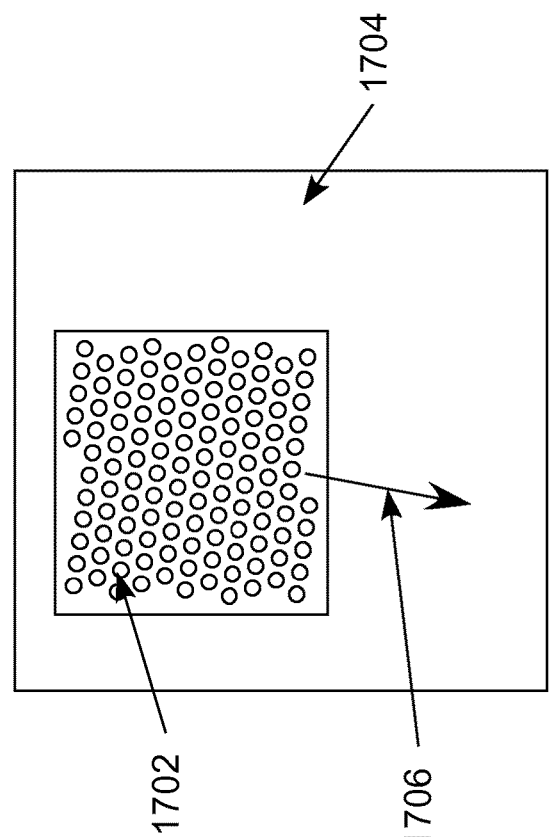
FIG. 17A
FIG. 17B

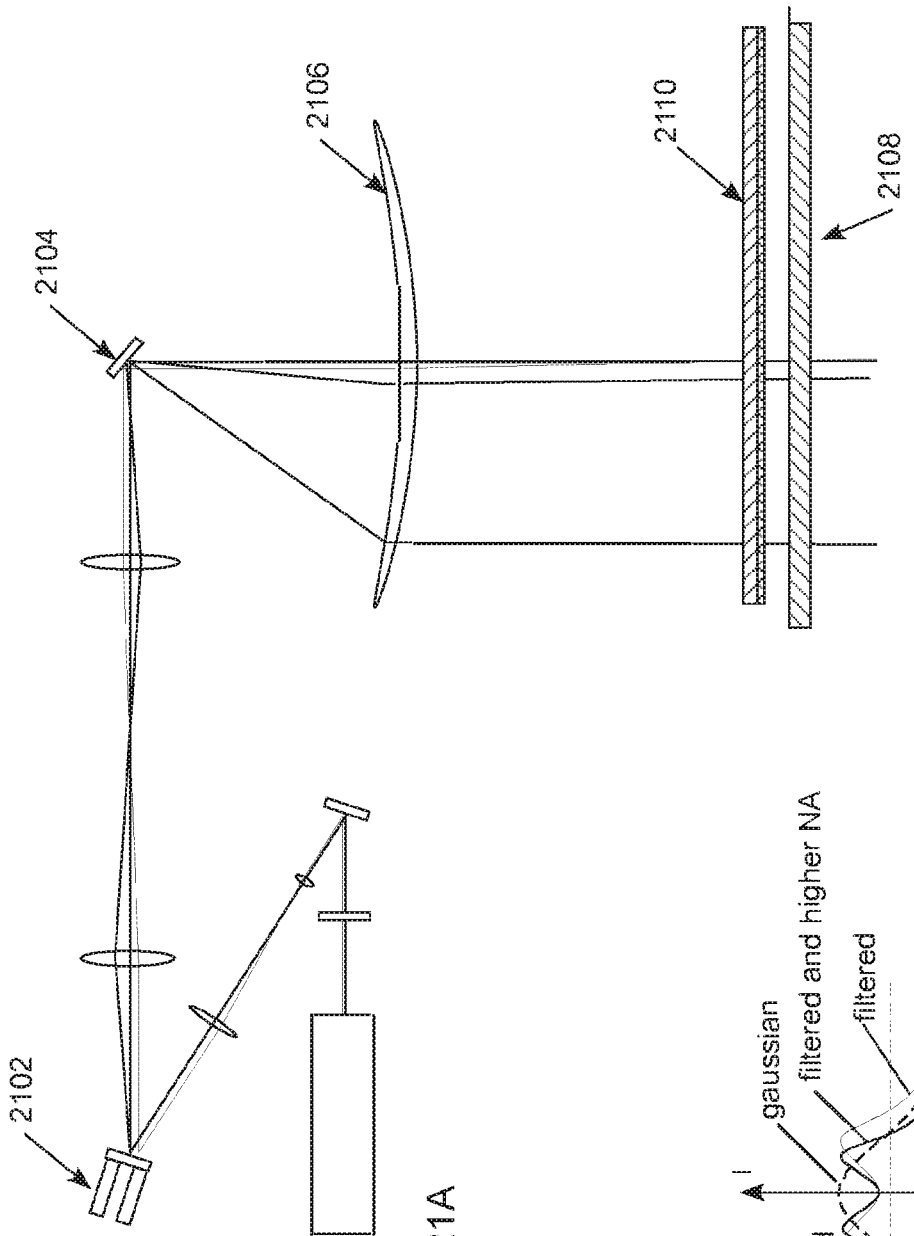

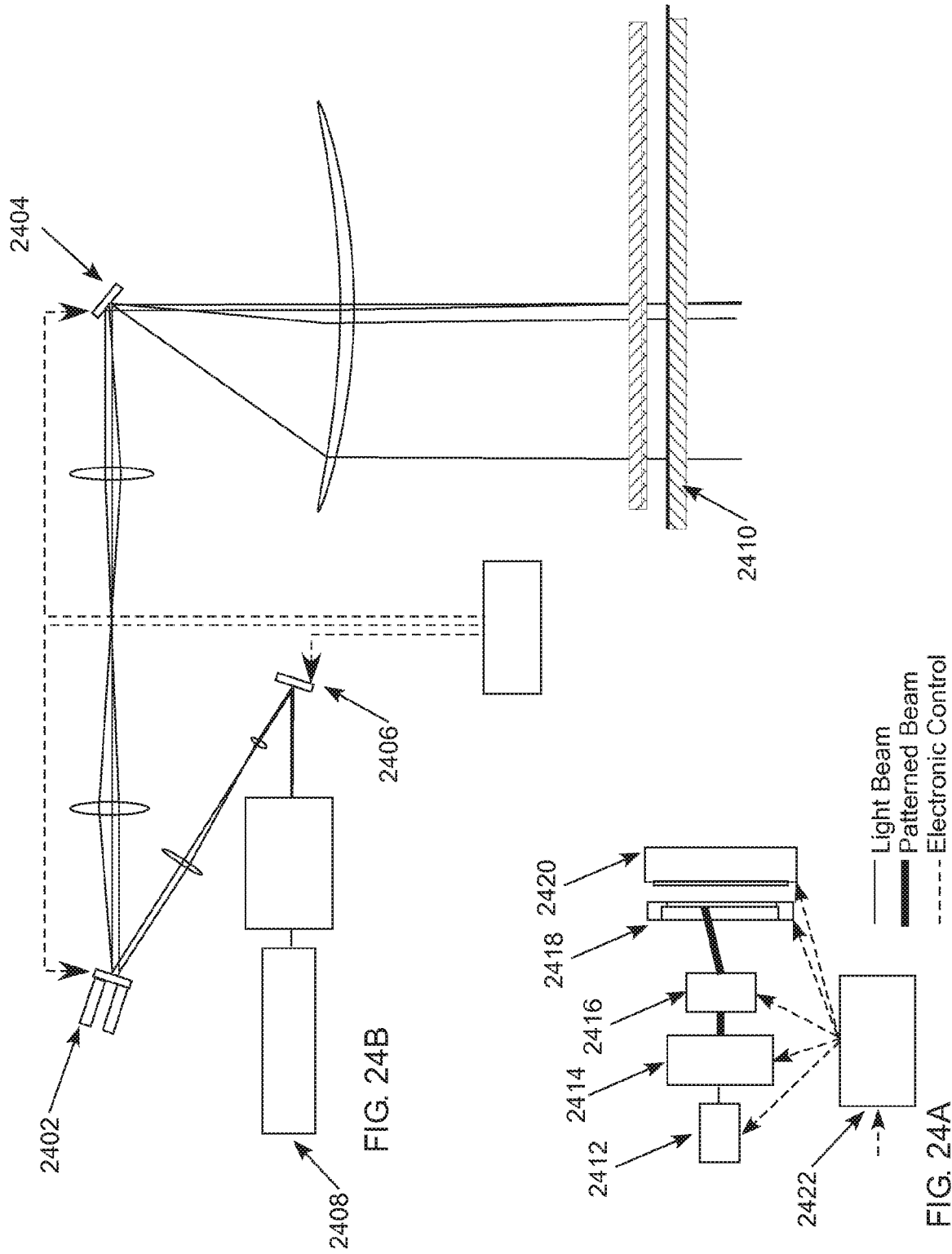

RECURRING PROCESS FOR LASER INDUCED FORWARD TRANSFER AND HIGH THROUGHPUT AND RECYCLING OF DONOR MATERIAL BY THE REUSE OF A PLURALITY OF TARGET SUBSTRATE PLATES OR FORWARD TRANSFER OF A PATTERN OF DISCRETE DONOR DOTS

PRIORITY APPLICATION

This application is the U.S. national stage of PCT Application No. PCT/EP2016/052430, filed Feb. 4, 2016, titled "RECURRING PROCESS FOR LASER INDUCED FORWARD TRANSFER AND HIGH THROUGHPUT AND RECYCLING DONOR MATERIAL BY THE REUSE OF A PLURALITY OF TARGET SUBSTRATE PLATES OR FORWARD TRANSFER OF A PATTERN OF DISCRETE DONOR DOTS" which is related to and claims the benefit of U.S. Provisional Patent Application 62/112,628, "Improved System and Method for Material Deposition", filed on Feb. 5, 2015.

BACKGROUND

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves may also correspond to implementations of the claimed technology.

This application relates to material deposition using Laser-Induced Forward Transfer, also referred to as LIFT. LIFT is an industrial process of ejecting a patch of material from a donor sheet to an acceptor workpiece. The transferred material can be in the form of a thin layer, a thick layer, a paste, a viscoelastic, or a liquid layer. The transfer does not depend on chemistry so any chemical compound can be transferred. The transferred donor material can be a single film, a complex film like an OLED stack, or a functional material like a layer of organic materials, including living cells. The film can be transferred as a melted drop, a pellet, a round patch or a complex shape ("decal"). A solid material can liquefy due to heating or due to its rheological properties and return to solid after impact with the workpiece. The impact energy can be high enough to give good contact and sticking to the acceptor surface. One application is to deposit metal for electric conductors, e.g. for repair of circuits. Another application is jetting of "rheological material", which are not solid and have a complex viscosity, e.g. pastes loaded with ceramic powder, metal particles or nanomaterials. Another application is jetting of biological substances, from reactants in diagnostic screen to living cells for building of two- and three-dimensional tissues and grafts.

A principal of LIFT is that it is an additive process where material is transferred only where needed and therefore LIFT can save expensive materials in contrast to a blanket coating on a workpiece wherein portions of the blanket coating are etched away or otherwise removed where the coating is not needed. LIFT is also a fast and simple one-step process for creating a coating or a pattern, and is finished immediately after the transfer with no need for pre-coating of the workpiece or resist processing. LIFT is therefore very suitable to direct writing in fields like printed electronics, especially roll-to-roll processing, making of printing plates, sign making, and security printing.

LIFT may have similar applications as inkjet, however due to the flexible nature of LIFT it allows printing of many more materials: viscous, hard, dry, granular, and layered. The possible range of shot sizes is very wide from 1 micron in diameter and a thickness of 0.1 micron to several nanoliters in volume. This is a larger range than can be done by ink jetting. In particular LIFT can shoot smaller shots than an inkjet system. The term laser jetting is used herein as synonymous to LIFT.

Despite the benefits of LIFT, it has not reached widespread use in industry. One reason is current LIFT technology is a slow process where the donor sheet has to be physically moved relative to the workpiece. If, for reasons of efficient use of donor material, the donor sheet needs to move relative to the stage such movements may take 30-100 milliseconds. Other issues relate to holding the small gap between the donor and the acceptor constant for large workpieces.

It is the purpose of this application to devise methods to make the process more industrial by providing architectures with high writing speed and high precision and for easy adaption to different process conditions. Throughput is improved by reduced overhead and by using an uninterrupted feeding of donor to the writing head also for sticky, liquid, or perishable donor material. Methods are disclosed to combine continuous feeding of donor instead of step-wise movement and for efficient use of donor material. Printing speed and precision and process flexibility is improved by donor sheets design.

SUMMARY

The present disclosure relates to high utilization of donor material in a writing process using Laser-Induced Forward Transfer. Specifically, the technology relates to reusing, or recycling, unused donor material by recoating target substrates with donor material after a writing process is performed with the target substrate. Further, the technology relates to target substrates including a pattern of discrete separated dots to be individually ejected from the target substrate using LIFT.

More specifically, the technology relates to addressing problems of low throughput and low utilization of, potentially expensive, donor material associated with currently available LIFT devices and processes. These problems are addressed by the features related to a recurring process of providing a plurality of target substrate plates and concurrently with pulsing a laser beam through a first target substrate plate, recoating with donor material a second target substrate, where the second substrate includes portions from which donor material was previously transferred in an iterative closed loop process.

The technology disclosed can provide the effect of efficient and high throughput laser induced forward transfer of donor material to achieve a high utilization of the donor material in a LIFT process according to the device and methods defined by the claims. According to some investigations made by the inventors, up to above 80% utilization rate of the donor material may be achieved.

As an example, the technology disclosed provides the effect of a high utilization of donor material by efficiently reusing, or recycling, the donor material in a LIFT process. According to some investigations made by the inventors, up to above 80% utilization rate of the donor material may be achieved by efficiently reusing, or recycling, the donor material using unused donor material from a previous writing process step. The high utilization rate can be further improved by introducing new iterative closed loop processes as defined by the claims.

Further, the technology disclosed can provide the effect of high throughput for the transfer of donor material to the workpiece by proposing a recurring process providing a plurality of target substrate plates and concurrently pulsing a laser beam through a first target substrate plate, recoating with donor material a second target substrate where the second substrate includes portions from which donor material was previously transferred in an iterative closed loop process.

Further, the technology disclosed can provide the effect of improved utilization rate of the donor material by proposing a recurring process providing a plurality of target substrate plates and concurrently pulsing a laser beam through a first target substrate plate, recoating with donor material a second target substrate where the second substrate is recoated by reusing, or recycling, at least portions of the unused donor material remaining from a previous laser induced forward transfer of donor material in an iterative closed loop process.

Other aspects and advantages of the technology disclosed can be seen on review of the drawings, the detailed description and the claims, which follow.

BRIEF DESCRIPTION OF THE DRAWINGS

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings, in which:

FIGS. 1A-B illustrate embodiments of target substrates and mechanisms of ejecting donor material.

FIGS. 2A-C illustrate ejection donor material with an explosive layer.

FIGS. 4I-L illustrate ejection of discrete dots of donor material.

FIGS. 5A-D illustrate example methods to achieve a high utilization of donor material by pre-assigning ejection locations.

FIGS. 6A and 6B illustrate the advantages of ejecting donor material from the exact locations of pre-assigned dots on the target substrate.

FIGS. 7A and 7B illustrate the advantages of ejecting donor material from the exact locations of pre-assigned dots on the target substrate FIGS. 8A, 8B, 9A and 9B illustrate example embodiments of preformed dots and examples of how the pre-formed dots may be formed on a transparent carrier.

FIGS. 10A-10C illustrate methods using continuous motion of the target substrate relative to the workpiece.

FIG. 15B illustrates an embodiment of a system including a recoating station, an exposure station and a plurality of target substrate plates.

FIG. 15C-F illustrate embodiments of target substrates to be coated at a regeneration station.

FIG. 15G illustrates an embodiment of a system including a recoating station, an exposure station and a cassette holding a plurality of target substrate plates.

FIGS. 17A and 17B illustrate examples of oblique relative scanning of the donor and workpiece.

FIGS. 21A and 21B illustrate an embodiment of an optical system and Gaussian spot.

FIGS. 24A and 24B illustrate embodiments of optical systems with spatial light modulators.

DETAILED DESCRIPTION

Figure 3C:
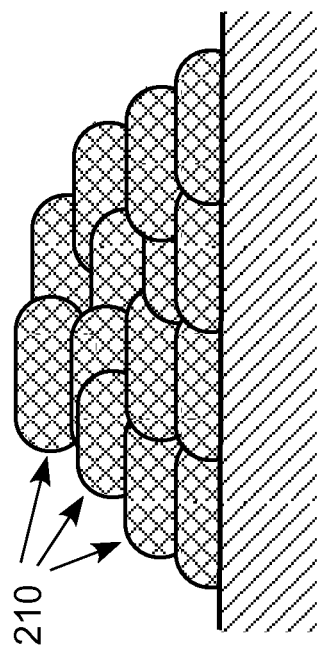
FIGS. 3A-C depict a plurality of different types of feature that may be created as part of a pattern on a workpiece.

The following detailed description is made with reference to the figures. Sample implementations are described to illustrate the technology disclosed, not to limit its scope, which is defined by the claims. Those of ordinary skill in the art will recognize a variety of equivalent variations on the description that follows.

FIG. 1A depicts an embodiment of a donor sheet, also referred to herein as a target substrate. In the embodiment shown, the target substrate includes a transparent carrier 100, also referred to as a donor substrate and a layer of donor material 102. The transparent carrier 100 provides support for the donor material 102 and is configured to be transparent to the laser beam to be absorbed by the donor material which causes LIFT to occur. In embodiments, the transparent carrier comprises clear plastic, polyimide, PC, PET, PEN, thin glass, or a glass sheet; or a combination thereof. The thickness of the donor sheet may be between 20 microns and 500 microns for plastic film and up to several millimeters for hard plastics and glass plates. The thickness of the transparent carrier is determined based on the support and flexibility requirements of the donor material and specific LIFT application. For example, in embodiments a target substrate that is rolled for storage includes a thin flexible transparent carrier.

In the example shown in FIG. 1A, the layer of donor material 102 is a single layer film. However in embodiments, the film may include multiple layers of donor material. For example the donor material may comprise multiple layers, each of different composition, for example an OLED stack. Further, in embodiments the donor layer may include a functional film including organic materials or living cells.

As shown in FIG. 1A, in a single layer donor material embodiment, a laser pulse 108 is focused through the transparent carrier 100 and a portion 110 of the donor material at the interface of the transparent carrier absorbs the laser energy and is evaporated. The vapor pressure of the evaporated donor material ejects a section of the donor material across a gap 106 to the acceptor surface 112 of a workpiece 104.

In embodiments, the donor material may not absorb light (e.g. a transparent material) and/or a may not evaporate cleanly. Therefore a dynamic release layer, "DR", or "explosive layer" may be used to assist with LIFT. The explosive layer can be a thin semitransparent metal film or a polymer layer loaded with a dye or pigment to absorb the laser light efficiently. In embodiments, the explosive layer is configured so that most of the laser energy is absorbed in the explosive layer and evaporates the explosive layer, giving an efficient conversion of laser pulse energy to mechanical work. The term "explosive" is used herein to refer to a reaction that happens in a very short amount of time, for example nanoseconds, and does not refer to actual explosive material, for example nitroglycerine.

In embodiments the target substrate may include additional layers which assist adhesion between layers of the target substrate and also aid in storage and rolling of the target substrate. For example, as shown in FIG. 1B, a surface active layer 122 may be located between the explosive layer 120 and donor material 102 to allow adhesion of the explosive layer 120 to the donor material 102. Further, in embodiments the transparent carrier 100 may be affixed to a surface active layer 124 on the outside surface which has properties that result in poor adhesion to the donor material 102 or a surface active layer 126 affixed to the outer surface of the donor material, as shown in FIG. 1B. These one or more surface active layers on the outside surface of the target substrate allow the target substrate to be rolled or stacked for storage without causing damage to the donor material. The outside surface active layer may be hydrophilic for fatty donor materials or hydrophobic for polar donor materials, in order to prevent the donor material from adhering to the outside surface. In embodiments, the surface active layer may be a substantial film or may only a molecule thick. The surface active molecules, in a surface active layer, typically have one end which sticks to the surface and another end with a specifically tailored surface energy, for example strongly polar or non-polar depending on if the surface active layer should adhere to another surface or not, and if that surface is polar or non-polar.

FIGS. 2A-C illustrate an example of the LIFT process using a target substrate similar to the one illustrated in FIG. 1B. As shown in FIG. 2A, a laser pulse 200 is emitted through the outside surface active layer and the transparent carrier 100 and is absorbed by the explosive layer 120. This absorption of laser energy causes the explosive layer 120 to create an explosion 204 and gas bubble 206 between the transparent carrier 100 and donor material 120 which ejects out a patch 208 of the donor material. The ejected patch flies across the gap to the acceptor surface 104 of the workpiece and sticks there as a deposit of donor material 210.

In embodiments, the gap may be dependent on the thickness of the donor material on the target substrate and the number of overlapping layers of donor material to be deposited in a pattern on the workpiece. For a particular process the gap between the donor and the acceptor need to be held constant within a reasonable error, e.g. within +1-10%. The nominal gap depends on the process. The gaps has to be small for micron-sized shots, e.g. around 50-100 microns, while for large shots with moderate precision requirements the gap may be around 1-2 mm. Many applications will fall somewhere in the middle in the span 100-1000 microns.

Many possible workpieces are large in area. Electronic boards and substrates are often processed in panels up to 24 inches in width, and the display industry use panels of 2-10 square meters in area. It is impossible to maintain a constant gap over such areas, unless very flat, very stiff, and very expensive substrates are used for both donor and acceptor. In order to maintain a constant gap over a large, possibly non-flat, workpiece a target substrate with a donor area much smaller than the workpiece is used, and this target substrate is several times during the printing of a large workpiece. The renewal of donor substrate is done in an uninterrupted automatic fashion. In an example embodiment the donor material comes from small target substrate, e.g. 50×50 to 100×100 mm, which are automatically exchanged when the donor is consumed. As discussed below, the target substrates may come from a stock of prefabricated target substrates including donor material, or the target substrates may be locally coated and recoated with donor material.

In a second example embodiment we use donor material on a tape, e.g. 30, 60, or 100 mm wide, which may be loaded as a roll or by an endless belt which is regenerated while being fed.

Figure 3B:
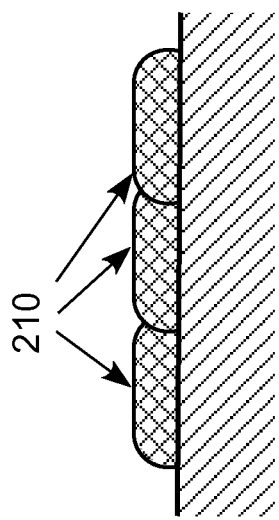
Figure 3A:
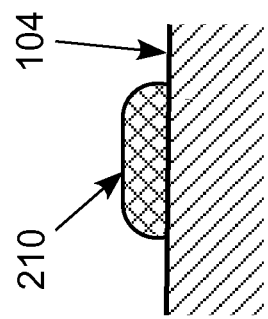

The technology disclosed herein may be used to create a wide variety of features on a workpiece using LIFT. FIGS. 3A-C depict a plurality of different types of feature that may be created as part of a pattern on a workpiece. FIG. 3A depicts a single shot 210 feature on the acceptor surface 104. FIG. 3B depicts a plurality of shots 210 deposited adjacently to one another on the workpiece to cover a larger area of the workpiece, for example to form a portion of a conductive line. FIG. 3C depicts a plurality of shots 210 deposited in a plurality of overlapping layers to form a thick feature. The overlapping layers create a buildup of a mass of donor material which is thicker than a single deposited dot. In this example, a series of ejected dots are ejected to overlap previously ejected dots until a desired thickness or volume has been created. When the surface finish of a feature is more important than the interior composition, the shot quality, aim, and absence of splatter for the interior shots is not critical, and therefore for the interior dots the LIFT parameters may be adjust in favor of speed over precision and finish quality.

Figure 4A:
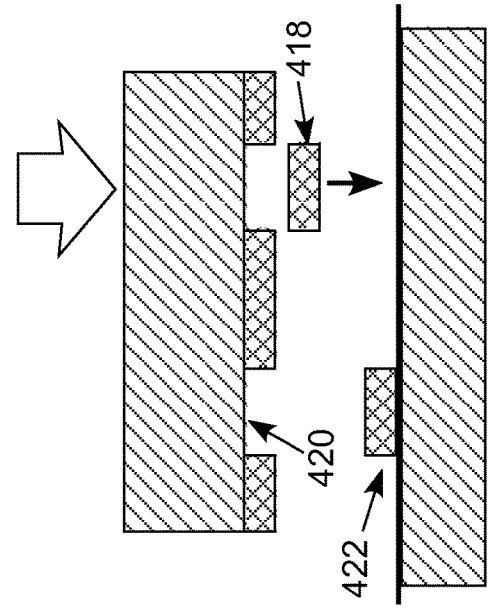
FIGS. 4A-H illustrate ejection donor material from a film of donor material.

FIGS. 4A-H depict four example situations of ejecting donor material from a target substrate to a workpiece. FIG. 4A depicts a laser beam 401 ejecting a single dot 402 from a target substrate including a transparent carrier 404 and a layer of donor material 406. In this example, as shown in a bottom view of the donor material 406 in FIG. 4E, prior to ejection the dot 402 is connected on all sides to donor material 406 which will not be ejected. This uniform and consistent attachment around the perimeter of the dot to be ejected results in the dot being ejected uniformly resulting in perpendicular travel towards the workpiece 408, which results in a predictable result for the deposited material.

Figure 4B:
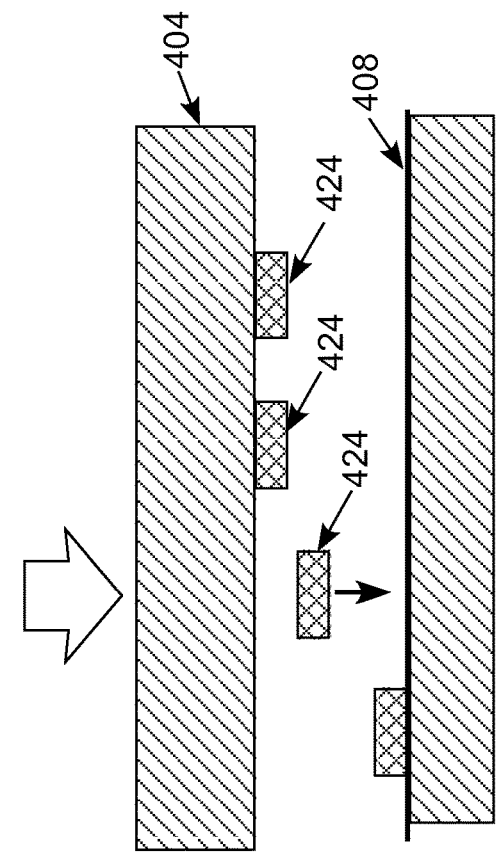

FIG. 4B depicts an example where a dot to be ejected 410 is located directly adjacent to a location 412 from which a dot 414 has previously been ejected. As shown in FIG. 4F, a bottom view of the donor material in FIG. 4B, the dot to be ejected 410 is attached to donor material, which will not be ejected in the shot, around most of its perimeter. However, a portion of the perimeter is directly adjacent to the location 412 from which a dot 414 has previously been ejected and therefore the dot to be ejected 410 is not attached to donor material on one side. Therefore, the dot to be ejected is non-uniformly attached to donor material. When ejected, this non-uniform attachment results in unsymmetrical forces and the ejected dot may tumble and go in a non-perpendicular direction 416, as is shown in FIG. 4B, due to higher ejection forces on the non-attached side. Further, the dot may fragment into satellites. The lack of precision of the resulting deposit in this case may not be suitable for the situations where precision deposition is required, for example the situations shown in FIGS. 3A and 3B which require precise deposition. However, ejection of non-symmetrically attached dots may be used for the fill mode, as shown in FIG. 3C, especially for the interior fill dots. This use of non-systematically attached dots improves the efficient use of donor area and allows faster jetting by ejecting adjacent spots sequentially. Further, in embodiments, a predicted non-perpendicular trajectory of a non-symmetrically attached dot may be calculated and the dot may be ejected at a location not directly above the target location for the deposited material in order to compensate for the non-perpendicular trajectory.

Figure 4C:
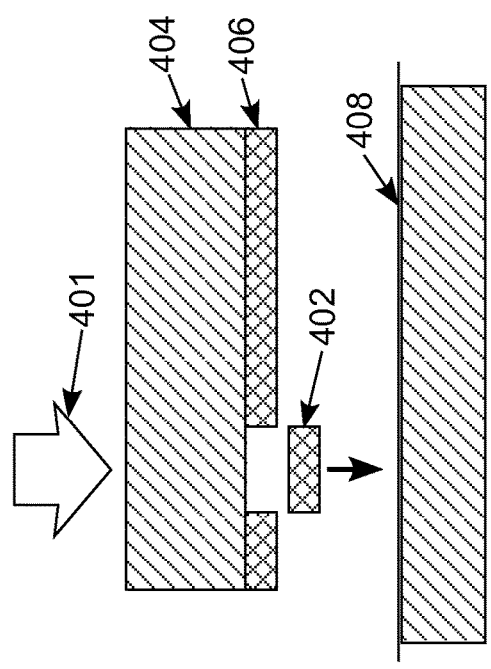
Figure 4D:
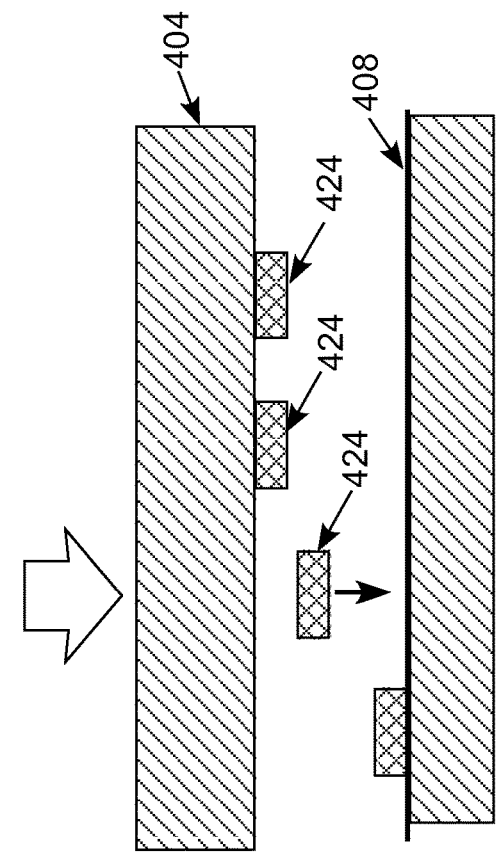
Figure 4E:
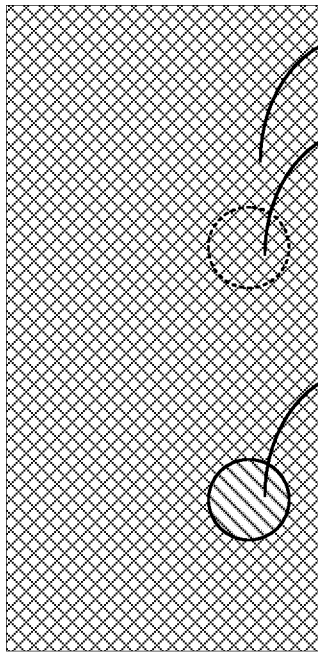
Figure 4G:
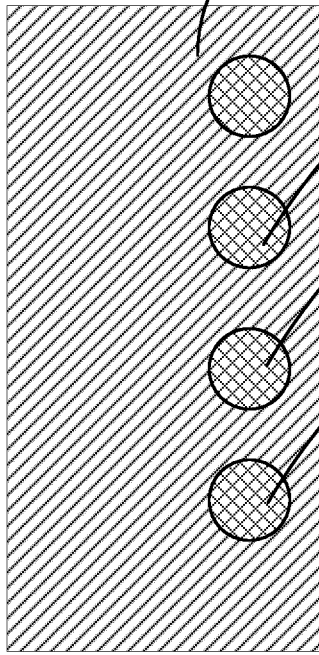
Figure 4F:
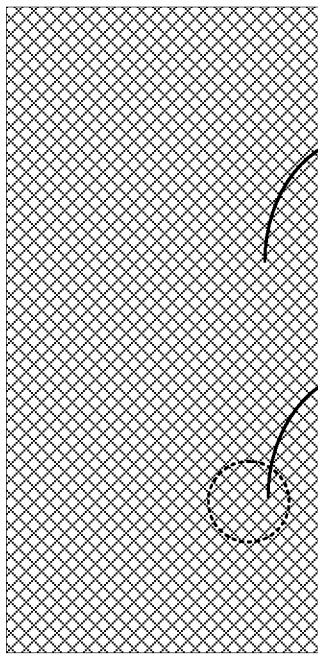

FIGS. 4C and 4G depict the jetting of a second dot 418 close to but separated from the location 420 of a previously ejected first dot 422. If the second dot 418 is located a sufficient distance away from the location 420 of the previously ejected first 422 dot then the absence of material at the location of the previously ejected first dot does not have an effect on the ejection of the second dot, and the second dot will eject will similar parameters as the example in FIG. 4C.

Figure 4H:
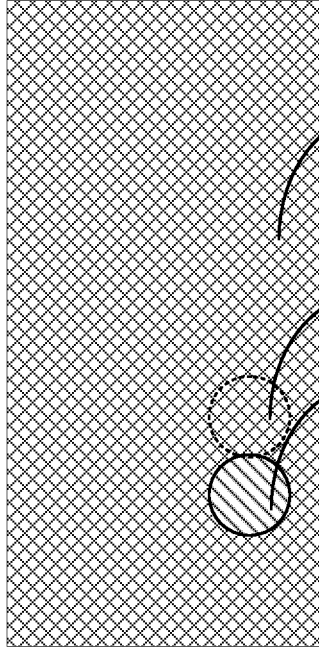

FIGS. 4D and 4H depicts a target substrate including a plurality of isolated islands 424 of donor material 412, attached to the transparent carrier 404, which are transferred to the accepter surface 408. As shown, the isolated islands 424 are discrete dots separated from surrounding dots. Using isolated islands of donor material has several advantages compared to the methods of ejecting portions of donor material from a continuous film of donor material, as shown in FIGS. 4A and 4B. One advantage of ejecting isolated islands is that the dots can be transferred without being sheared free from surrounding donor material, therefore less energy is required for ejection. Since less energy is needed to make the donor island free than is need for ejecting a plug, as in FIG. 4A, the target substrate may be highly sensitive to the laser. Therefore, a smaller laser can be used compared to the case where the plug of donor material is sheared free, as in FIG. 4A. The kinetic energy of a small donor dot is quite small and very little evaporated donor material is needed to propel the ejected donor dot to the acceptor.

When the interface material between the isolated island of donor material and the transparent carrier is evaporated, the adhesion of the isolated island of donor material to the transparent carrier is immediately lost because there is no surrounding donor material attached to the isolated island with shear force. This is true even if the evaporated interface material is extremely thin. Therefore it is possible to make a very sensitive donor sheet, by utilizing an extremely thin exploding layer. The absorption of light is high so the light energy stops within the thin film and the laser pulse is very short in order to lessen the heat spread by heat diffusion during the duration of the laser pulse. Polymers, used as an explosive layer, typically have a thermal diffusion constant of $10^{-7}$ m$^2$/s. With a 100 femtosecond laser pulse the heat diffusion length is only 100 nm and a very thin layer is evaporated or disintegrated into gas, needing only little energy. 100 mJ/cm$^2$ is a typical energy for LIFT of a plug from a sheet of donor material, with preformed dots the energy may be less than 10 mJ/cm$^2$ using short-pulse lasers and a properly tuned explosion layer. With low pulse energy the writing system is simplified and the donor is less affected by heating.

Since each donor island is free, i.e. not attached to any surrounding donor material, the aiming and uniformity of the laser jetting is predictable. Further, dots may be formed on the transparent carrier with high precision leading to dots with highly uniform size and shape. For example, the preformed dots can be made by molding or printing from a master, or they may be formed by filling of pits which are made from a precision master. In addition, the dots can be made by liftoff or other photolithographic process using a precision photomask as a master. These precision methods give highly precise and uniform dots. Alternatively, other less precise methods of forming dots may be used, including ink-jetting the dots onto a donor sheet. Dots formed by ink-jetting are less precise because ink-jetting may have uncertainty in aiming, shot size and edge quality.

FIGS. 8A, 8B, 9A and 9B show example embodiments of preformed dots and examples of how the pre-formed dots may be formed on a transparent carrier. FIG. 8A shows a profile view of preformed dots 802 on a flat surface of a transparent carrier 804, e.g. a polycarbonate film or a glass plate. The dots 802 may be formed by molding. FIG. 8B shows preformed dots formed by gravure-like printing from a master, here a cylinder 806, with pits 808 in the surface of the cylinder. The cylinder may be engraved to form the pits mechanically, chemically or optically or it can use a shim envelope with the pattern on. The dots may be formed in a grid pattern on the roller and the substrate. The donor material 810 is fed through a dispenser 812 onto the cylinder 806 including the pattern of dots. The cylinder is squeegeed, with a squeegee or scraper 814, to remove excess material 816 so that the only remaining material resides in the pits 816 on the cylinder 806. After filling the pits 808 on the cylinder, the cylinder 806 is rolled across a target substrate transferring the donor material in the pits to form a grid of separated discrete dots 804 on the target substrate. In embodiments, once deposited the dots may be cured onto the donor substrate. Further, in embodiments the donor substrate may include a layer to aid in adhesion of the donor material to the donor substrate.

In FIG. 9A, the donor substrate 902 includes pits 904 in a surface of the substrate. The pitted donor substrate can be produced by injection molding, heat embossing or nano-imprinting. In embodiments, the pits in the surface form a grid, for example in a Cartesian or hexagonal pattern. The donor material 906 is easily added to the pitted substrate as is shown in FIG. 9B and form isolated preformed dots 908 similar to as shown in FIG. 8A. For example, a paste or soft donor material may be deposited on the surface of the donor. The excess material may be scraped off by a sharp blade 910, e.g. a "doctor blade", or it may be scraped off by a soft edge, e.g. a "squeegee", depending on the mechanical properties of the donor.

The shape of the preformed dots on the target substrate defines the shape of the transferred donor features and therefore the optics requirements are relaxed compared to embodiments such as shown in FIG. 4A wherein the shape of the deposited material is primarily dependent on the properties, e.g. shape, power and duration, of the laser beam pulsed through the target substrate. FIG. 4I shows and embodiment of a target substrate including a grid pattern of preformed dots 430 wherein the preformed dots are smaller than the focus area 432 of the laser beam used to eject the preformed dots. This allows both the shape and location of the laser beam to be less precise while still resulting in a well aimed ejection of donor material. As shown in FIG. 4I, the size of the focus area 432 of the laser beam is small enough and the spacing of the preformed dots is large enough so that ejecting a first preformed dot 434 does not result in ejection of the preformed dots 436 surrounding the first preformed dot 434.

FIG. 4J illustrates a donor sheet including preformed features 438 having different shapes, sizes and orientations, for example first preformed feature 440 has a "T" shape and second preformed feature 442 has a square shape. To use a donor sheet as shown in FIG. 4J the system controller assigns the donor features to pattern elements on the workpiece. Further, similar to discussed above relating to FIG. 4I, to eject a preformed feature 438 using LIFT, the focus area 432 of the laser beam used to eject the preformed feature is larger than the preformed feature.

While the examples shown in FIGS. 4I and 4J include X-Y Cartesian grids, in embodiments the target substrate may be coated with donor material in any number of discrete dot configurations. For example, a hexagonal pattern. Further, as noted, the discrete dots may be of any shape, for example circular, oval, square triangular, or a shape corresponding to a structure of an electronic component to be formed on the workpiece, for example a transistor or a diode. The shape of the discrete dot may include a 2-dimensional outline with uniform thickness throughout the dot. In embodiments, the shape may be 3-dimensional with portions of a dot having different thickness, as is shown in FIGS. 4K and 4L. In FIG. 4K, preformed features 444 on a flat donor substrate 446 have varying thickness. Once ejected, the resulting deposited dot 448 includes corresponding varying thickness, as is shown in FIG. 4K.

In FIG. 4L a donor substrate 450 includes pits 452 have varying depth resulting in the ejected deposited dots 454 having varying thickness. As shown in FIGS. 4K and 4L, ejecting a discrete dot with varying thickness will result in deposited donor material on the workpiece with varying thickness. Further in embodiments, the grid of discrete dots may include dots of two or more different thicknesses.

In embodiments wherein the laser beam focus area on the preformed dots is larger than the outline of the preformed dots, such as shown in FIGS. 4I and 4J, the donor sheet is configured so that the required energy of the laser to eject a discrete dot does not damage the workpiece when the portions of the laser beam that do not hit the preformed dot hit the workpiece. Further in embodiments, the donor sheet may include a light absorbing layer around the preformed dots which absorbs the laser beam around the preformed dots.

In addition to achieving uniform ejection and high utilization of donor material using the discrete dot method discussed above, uniform ejection and high utilization of donor material may also be accomplished using a film of donor material on a target substrate by pre-assigning dots locations to eject donor material. As discussed above relating to FIG. 4B, ejecting non-symmetrically attached dots of donor material may be undesirable due to non-perpendicular and or unpredictable ejection of donor material. Therefore in some cases it is desirable to only eject dots of donor material attached to unejected on all sides during a patterning process. However, this results in large portions of donor material remaining on the transparent carrier that will not be used, which is not an efficient utilization of donor material. This low utilization of donor material is undesirable, particularly if the donor material is expensive.

FIGS. 5A and 5B depict an example method to achieve a high utilization of donor material, using a target substrate including a layer of donor material, by pre-assigning ejections locations for dots of donor material. Using the LIFT process a pattern is formed on a workpiece using donor material ejected from pre-assigned dot locations on a target substrate through a combination of positioning and repositioning of the target substrate relative to the workpiece, and using optics to position the laser beam in the appropriate location to focus on a pre-assigned dot location for ejection of donor material.

In embodiments the pre-assigned dot locations form a tight pattern, with very little or no donor material between pre-assign dots. A tight pattern achieves high utilization of the donor material. In embodiments, the pattern of pre-assigned dots may be divided into sub-patterns, wherein all the dots in a sub-pattern are ejected prior to ejecting dots in other sub-patterns. For example, dots in a first sub-pattern are each ejected in a first pass prior to ejecting the dots in a second sub-pattern in a second pass. The sub-patterns each contain a plurality of pre-assigned dots which will have symmetrical attachment to surrounding donor material after the donor material in the pre-assigned dot locations of the previous passes are ejected. Therefore the use of patterns, with sub-patterns, of pre-assigned dots is both efficient and leads to high quality ejections due to avoiding the ejection problems caused by ejection of dots with non-uniform/symmetrical attachment to surrounding donor material.

FIGS. 5A and B illustrate an example of a pattern of pre-assigned dots. The pattern is a hexagonal pattern divided into three sub-patterns to be ejected in three sequential passes. The three passes result in the dots of each pass having symmetrical attachment to the surrounding unejected donor material which avoids the problems illustrated in FIG. 4B where an ejected dot is non-symmetrically attached to surrounding donor material and ejects with a non-perpendicular trajectory.

FIG. 5A shows a donor sheet including a layer of donor material 500. The locations of the pre-assigned dots are shown for illustrative purposes with different fill patterns, however in implementation there are not markings or indications on the donor sheet for the pre-assigned dot locations. As shown, on the left side of the donor sheet there is a plurality of first pass pre-assigned dot locations 502, illustrated with a fine diagonal fill pattern. In the middle of the donor sheet, are a plurality of first pass pre-assigned dot locations 502 and a plurality of section pass pre-assigned dot locations 504, illustrated with a coarse diagonal fill pattern. As illustrated the first pass pre assigned dot locations 502 overlap on three sides, in a radially symmetrical way, with three second pass pre-assigned dot locations 504. On the right side of the donor sheet, are plurality of first pass pre-assigned dot locations 502, a plurality of second pass pre-assigned dot locations 504, and a plurality of third pass pre-assigned dot locations 506, illustrated with a medium vertical line fill pattern. As depicted, the hexagonal pattern includes interstitial space between the first pass pre-assigned dot locations 502 occupied by second pass pre-assigned dot locations 504 and third pass pre-assigned dot locations 506. Specifically, the interstitial space is occupied by three second pass pre-assigned dot locations 504 and three third pass pre-assigned dot locations 506 around and overlapping the first pass pre-assigned dot location 502 in an alternating pattern of second and third pass pre-assigned dot locations.

FIG. 5B depicts a donor sheet depicting portions after the first ejection pass, after the second ejection pass and after the third ejection pass. The left side of FIG. 5B, depicts a portion of the donor sheet after the ejection of the first pass. Prior to ejection, each of the dots 508 ejected in the first pass were entirely attached to surrounding donor material.

The middle portion of FIG. 5B depicts a portion of the donor sheet after the ejection of the second pass. Prior to the second pass ejection, each of the dots 510 ejected in the second pass, illustrated with a hatched circle, were symmetrically detached from donor material on three sides corresponding to three locations previously occupied by three dots ejected in the first pass. This symmetrical attachment and detachment results in perpendicular transfer of the dots, as discussed above.

As shown on the right side of FIG. 5B, the pre-assigned third dots 512 are ejected in a third pass. Prior to ejection during the third pass, each of the dots 512 ejected in the third pass, illustrated with a hatched circle, are detached from donor material on all sides corresponding to three locations previously occupied by donor material ejected for three first dots in the first pass and three locations previously occupied by donor material ejected for three second dots in the second pass. The ejection of the third dots in the third pass is similar to the ejection of discrete dots discussed above, and results in perpendicular transfer of the dots with lower required laser energy to eject the dots because no shearing from surrounding donor material is required. As shown in the right side of FIG. 5B, after ejection of the all three passes essentially 100% of donor material in areas of the target substrate exposed to all three passes is transferred due to the very dense packing of dots in the hexagonal pattern, which included a slight overlap of dots in each of the passes. As noted above, this high utilization is beneficial when the donor material is expensive.

As shown in the examples in FIGS. 5A and 5B, the dots in each pass are the same size as the dots in the other passes. In embodiments, the laser energies, duration, and focus areas used for the three sets of dots can be tuned so that the three sets of dots have the same volume. For example, because the second pass dots require less shear energy to remove the dot from the target substrate less laser energy may be used.

The depicted hexagonal pattern of dots is for exemplary purposes and in embodiments other patterns of dots may be used to achieve similar high utilization of donor material. For example, as depicted in FIG. 5C, a target substrate may include a stripe of donor material 550 attached to a transparent carrier 551. The stripe of donor material divided into a pattern of strips to be ejected in two passes, including strips of a first pass 552, illustrated with a cross hatch fill, and strips of a second pass 554, illustrated with a fine diagonal line fill. As shown, the first pass strips 552 are attached to donor material on two sides prior to ejection in a first pass. Further, the second pass strips 554 are not being attached to any donor material after the first pass of strips are ejected. Therefore, symmetrical attachment and detachment is achieved in both passes and ejection of both passes will be uniform.

FIG. 5D depicts another example embodiment of a pattern of pre-assigned dots to be ejected from a film of donor material in multiple passes. The pattern includes an X-Y array of square shaped dots. As depicted, the dots include dots to be ejected in a first pass 556 and dots to be ejected in a second pass 558. As shown on the left side of FIG. 5D, prior to ejecting the first pass the first pass dots 556 are attached on all four sides by second pass dots 558. However, during the first pass, prior to ejection some first pass dots are surrounded by less than four first pass dots on the corners of the dot due to prior ejection of first pass dots. For example first pass dot 560 is only surrounded by first pass dots 556 on two corners. Because the dots around the corners of a square dot are essentially not attached to the square dot, the presence or absence of donor material at the corner dot locations will have a negligible or no effect at all on the systematical ejection of the dot.

Further, as shown, prior to being ejected in the second pass second pass dots 558 are detached on all four sides, after ejection of dots in the first pass. This symmetrical detachment leads to uniform ejection as discussed above. However, during the second pass, prior to ejection some second pass dots are surrounded by less than four second pass dots on the corners of the dot due to prior ejection of second pass dots. For example second pass dot 562 is only surrounded by second pass dots 558 on two corners. As noted above, because the dots around the corners of a square dot are essentially not attached to the square dot, the presence or absence of donor material at the corner dot locations will have a negligible or no effect at all on the systematical ejection of the dot.

The illustrative embodiments have shown high utilization and symmetrical ejection achieved with two and three pass example. However in embodiments, other numbers of passes may be used. For example, the hexagonal pattern shown in FIG. 5A may be divided in four sub-patterns to be ejected in four passes, wherein each pass include symmetrically attached dots.

FIGS. 6A and 6B further illustrate the advantages of ejecting donor material from the exact locations of pre-assigned dots on the target substrate. FIG. 6A shows a regular array of pre-assigned dot positions 602 on a donor. The target substrate may be scanned across the surface of an acceptor workpiece to align the pre-assigned dots with target spots of a pattern on the workpiece. In embodiments, the mechanical motion of the scanning may not be fast enough to position a pre-assigned dot position on the target substrate to the exact position of the target spot on the workpiece. Therefore, instead of ejecting donor material from the exact locations of the pre-assigned dots as shown in FIG. 6A, the laser beam is slightly shifted using a fast servo and shot to eject a dot of donor material near a pre-assigned dot position, as shown in FIG. 6B. FIG. 6B provides an example result of precise targeting achieved by shifting the position of the actual ejected dot of donor material. As shown, some of the dots in the array of ejected dots 604 are shifted from the pre-assigned dot positions 602, illustrated with hatched circles. Because the irregularly size and position of the interstitial space between the ejected dots in FIG. 6B, the surface filling scheme in FIGS. 5A-B cannot be used because the shifted dots remove material in locations of pre-assigned dots in subsequent passes.

FIGS. 7A and 7B show an example similar to FIGS. 6A and 6B wherein the initial grid of pre-assign dots 702 includes a larger separation which allows the dots to moved+/−0.5 dot diameters before they risk merging with another dot moved in the opposite direction. In FIG. 7B an example pattern of ejected dots 704, relative to the initial grid of pre-assign dots 702, is shown after the laser beam is shifted for some dots to achieve ejection at a precise target spot on the workpiece. As shown in FIG. 7B, the result is also an inefficient use the donor area.

In order to achieve precise deposition of donor material at target spots on a workpiece while using pre-assigned spots without shifting the laser beam as shown in FIGS. 6A-7B, methods using continuous motion of the target substrate relative to the workpiece may be utilized. In previous LIFT processes the donor sheet is position over a portion of the workpiece and while stationary a plurality of areas of donor material are ejected onto the workpiece to form a pattern. This process is slow and does not result in high utilization of the donor material.

FIGS. 10A-14B depicts methods using continuous motion of the target substrate relative to the workpiece to achieve precise deposition of donor material and high utilization of donor material. In embodiments, the target substrate is caused to move relative to the workpiece and with relative motion a laser causes ejection of donor material onto the workpiece.

Aspects of technology discussed above, relating ting to FIGS. 5A-D, 8A-B, and 9A-B may be used with the continuous motion technology disclosed herein. FIG. 10A depicts a method of selecting a pre-assigned dot location to be ejected onto a target spot 1002 on a workpiece. As discussed above, pre-assignment allows for greater utilization of donor material as oppose to ejection at random locations. As shown, the target substrate including a grid pattern of pre-assigned dot locations 1004 that are aligned at an oblique angle relative to the relative motion 1006 of the target substrate and workpiece. While in this example, the target substrate includes a film with pre-assigned dots, similar embodiments may include a target substrate with a grid pattern of discrete dots which may be aligned at an oblique angle relative to the relative motion of the target substrate and workpiece. Due to the oblique angle alignment, a plurality of pre-assigned dot locations, including locations 1008, 1010, 1012, 1014, 1016 and 1018, will overlap the central portion of the target spot 1002, as the target substrate moves along the path of relative motion 1006 over the workpiece. As illustrated, some of the plurality of pre-assigned dot locations 1008, 1010, 1012, 1014, 1016 and 1018 will overlap the target spot 1002 more than others. Due to the preassigned nature of the dots, there may not be a dot that will exactly overlap with the target spot. The control system of the writer may include a predefined error threshold relating to the allowable error between a target spot on the workpiece and the location of deposited material from a pre-assigned dot location. If ejection of a pre-assigned dot will overlap the target spot within the error threshold then the pre-assigned dot may be selected to be ejected. FIG. 10B shows the positions of deposited material from dot locations 1008, 1010, 1012, 1014, 1016 and 1018 relative to the target spot 1002. As shown, dot location 1018 results in the smallest error and if within the preselected error threshold may be selected. However, if another dot, for example dot location 1008, overlaps target spot 1002 prior to dot location 1018 and is within the error threshold, then dot location 1008 may be selected because it overlaps first in time even though it does not have the smallest error. In embodiments, both order of dots and error deviation from the target spot may be used to determine the selection of pre-assigned dot to be ejected.

The embodiment shown in FIG. 10B utilized an on demand laser that may be fired when the selected pre-assigned dot is in alignment with the target spot in the direction of relative movements. This is evidenced by the dots in FIG. 10B only having an error deviation from the target spot in one direction. In embodiments, the laser may be a pulsed laser that may not be fired on demand. In these embodiments, the selected dot may have an error in both the direction of relative motion and the direction perpendicular to relative motion as is shown in FIG. 10C. Similar to as discussed above relating to FIG. 10B, the pre-assigned dot that is within the error threshold in both directions is selected to be ejected.

Figure 11:
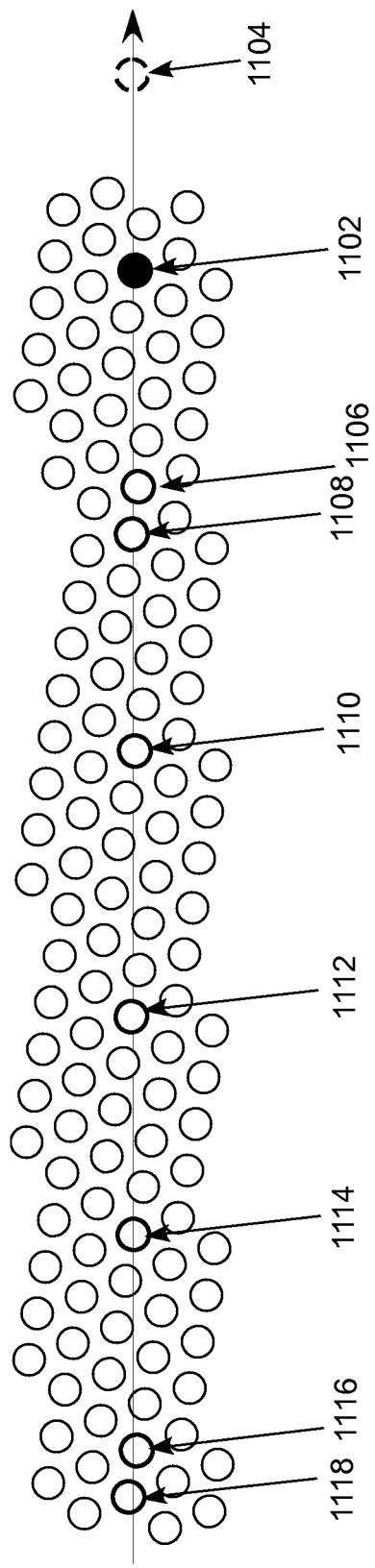
FIG. 11 illustrates redundancy in selecting a dot to select.

During the exposure process, the first pre-assigned dot location on the target substrate within the error threshold for a target spot may already have been ejected and therefore cannot be used again. Therefore in embodiments, a pre-assigned dot location that subsequently overlaps the target spot may be selected and ejected. In embodiments, a larger error threshold allows for greater redundancy and further allows for optimization for efficient use of the pre-assigned spots. For example, as shown in FIG. 11, the first pre-assigned dot location 1102 is within the error threshold to be selected for ejection onto the target spot 1104, however first pre-assigned dot location 1102 has already been ejected. Therefore, another pre-assigned dot within the error threshold must be selected. As shown, a plurality of pre-assigned dot locations 1106, 1108, 1110, 1112, 1114, 1116, and 1118 are within the error threshold and may be selected to be ejected onto the target spot. The redundancy makes it possible to select different dots and optimize other parameters, e.g. time or utilization of donor area. In embodiments the finer the grid of preassigned dots, the smaller the error threshold that may be selected and still allow for redundancy, as well as the better utilization of donor material since many dots will be within an error threshold to be ejected. In embodiments, prior to selection it may be determined that the next dot to overlap the target spot within the error threshold would be better for a different target spot because it will result in overall better utilization of the donor material, and another dot within the error threshold may be selected.

In embodiments, the laser cannot issue two pulses in immediate adjacency but must have time to build up the pulse energy. Therefore, in embodiments sequential pre-assigned dots for ejection are selected taking into account the pulse timing parameters of the laser.

The donor material has a limited number of possible positions and they must be used efficiently. If the donor material has a pre-defined grid of dots, either physical patches of donor material or assigned spots on the surface, each dot can be pre-assigned to a position on the workpiece and a job plan calculated which satisfies the different restrictions and gives efficient use of time and donor material. In embodiments, the target locations matched with the pre-assigned dots are selected prior to any ejection in order to maximize the utilization of the donor sheet. However, in embodiments, the assignment may be done on the fly and the next dot within the next predetermine number of dots that has the smallest error which is lower than the error threshold is selected to be ejected onto the target location.

Figures 12A, 12B:
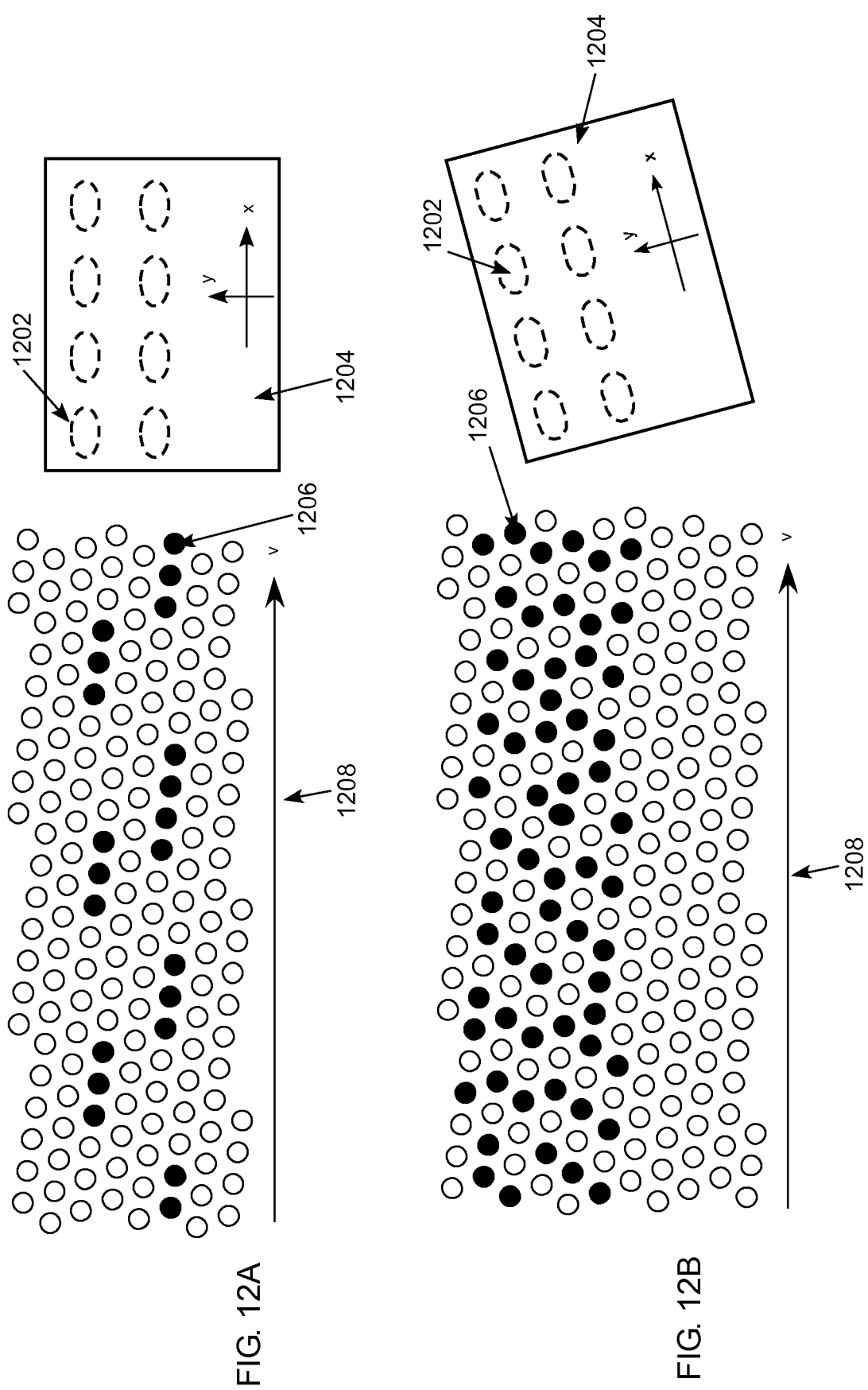
FIGS. 12A and 12B illustrate orienting the pattern of the workpiece askew to the relative direction of motion.

In embodiments, with certain geometries of patterns on a workpiece it is beneficial to rotate the axes of the pattern relative to the direction of relative movement of the target substrate and the workpiece. FIG. 12A depicts a grid of target spots 1202 to be patterned on a PCB workpiece 1204. The grid of target spots 1204 has an X and Y axes, which may be referred to as Manhattan geometry of the PCB. PCBs frequently include Manhattan Geometry wherein lines and pads are configured in a grid-like pattern with 90 degree angles.

Using the methods to scan and eject pre-assigned dots from a target substrates, as discussed above, may result in the pattern of ejected dots 1206 shown in FIG. 12A. As shown, the ejected dots 1206 are along stripes on the target substrate, and these stripes are separated by a stripe of un-ejected dots. With this orientation of the pattern relative to the movement 1208 of the target substrate and the workpiece, some stripes of pre-assigned dots on the target substrate will be depleted while other stripes are depleted to a much lower level or not at all. This leads to poor utilization of the donor material of the target substrate.

Therefore, in embodiments in order to increase the utilization of the donor material when patterning a workpiece with a pattern including Manhattan geometry, the pattern is aligned askew to the relative motion 1208 of the donor sheet and workpiece as is shown in FIG. 12B. As shown in FIG. 12B, the ejected dots 1206 are more evenly distributed across the target substrate than in FIG. 12A. This more even distribution is caused by the askew alignment of the pattern relative to the relative motion of the target substrate and workpiece.

Figure 13A:
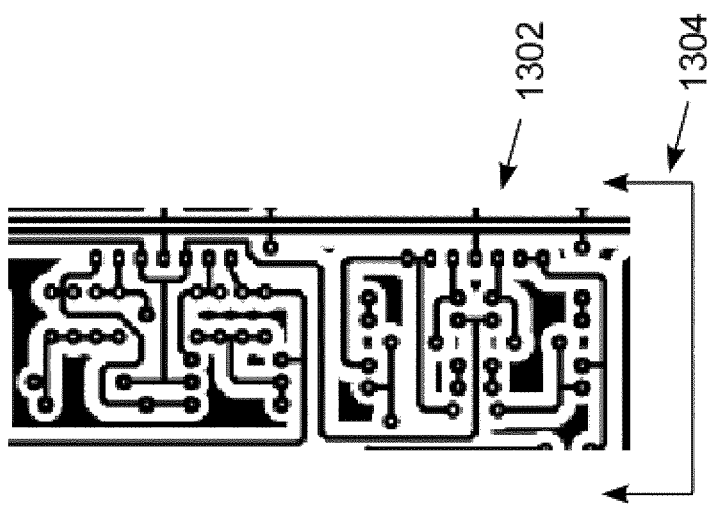
Figure 13B:
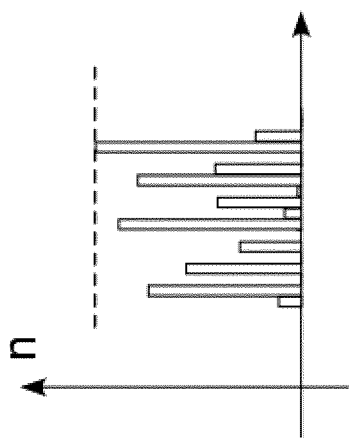

FIGS. 13A, 13B, 14A and 14B further illustrate the concept of orienting the geometry of the PCB 1302 askew to the direction of relative motion 1304 of the donor sheet and workpiece in order to more evenly distribute the usage of donor material across the donor sheet in a direction perpendicular to the relative direction of motion. As shown in FIG. 13A a circuit board is aligned with the Manhattan geometry features parallel to the direction of movement 1304. FIG. 13B shows a histogram of the distribution of required donor material to be deposited, where the Y-axis shows required donor material and the X-axis corresponding to paths parallel paths in the direction of motion across the target substrate in a direction particular to the direction of motion. As shown, this parallel alignment causes paths that include high usage of donor material where stripes of contact lines are formed. And further causes areas where very little donor material is required to be deposited. This creates very poor utilization of donor material because many paths along the direction of relative motion will hardly be used at all, while also a very large area of donor material along a path on a target substrate will be needed in order to deposit the material need in the spikes.

Figure 14A:
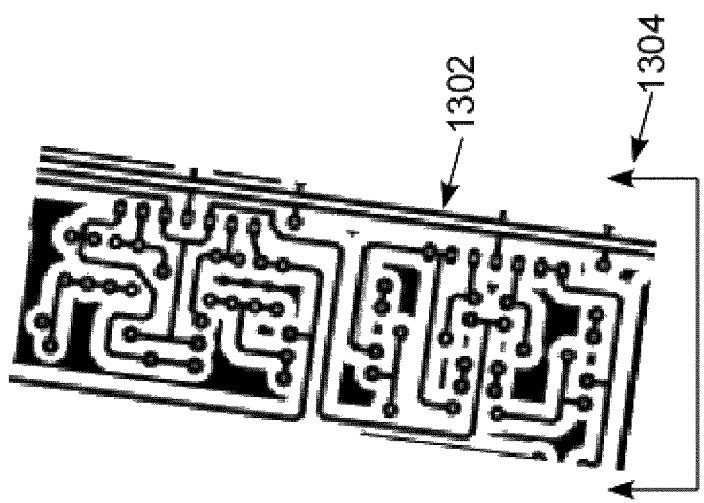
FIGS. 13A, 13B, 14A and 14B illustrate orienting the pattern of the workpiece askew to the relative direction of motion.
Figure 14B:
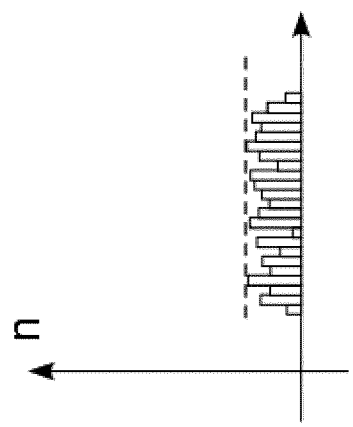

Therefore, as shown in FIGS. 14A and 14B, by aligning the Manhattan geometry 1302 askew to the direction of relative movement 1304, the features that previously required high amounts of donor material along a single path are now spread over several paths and therefore the distribution of required donor material is evened out.

As discussed above, high utilization of donor material may be achieved using by using a high proportion of the donor material deposited on a target substrate. These methods of high utilization of donor are especially useful in cases where it is practical to use prefabricated target substrate, for example target substrates including complex films. However, in embodiments prefabricated target substrates may not be practical due to properties of the donor material. For example, if the donor material is solid and dry or if it is perishable, it is beneficial to coat the transparent carrier only a short time before it is used. Example materials include perishable materials which dry or harden, such as solder paste, nanopaste, and conductive adhesive, and various glues and paints. The solder paste used in surface mounting needs to be tacky since components are pressed into the paste and sticks by the tackiness. The paste also has a limited useable time when exposed to air. Other perishable materials are foods and biological substances or structures. Also some chemical compounds have a limited life in air, e.g. organic electronic materials.

Therefore in embodiments, high utilization of donor material may be accomplished through methods which include coating a target substrate with donor material prior to LIFT exposure. These embodiments may include methods of reusing, or recycling, unused donor material from target substrate from which donor material was previously ejected and recoating the used target substrates.

Figure 15A:
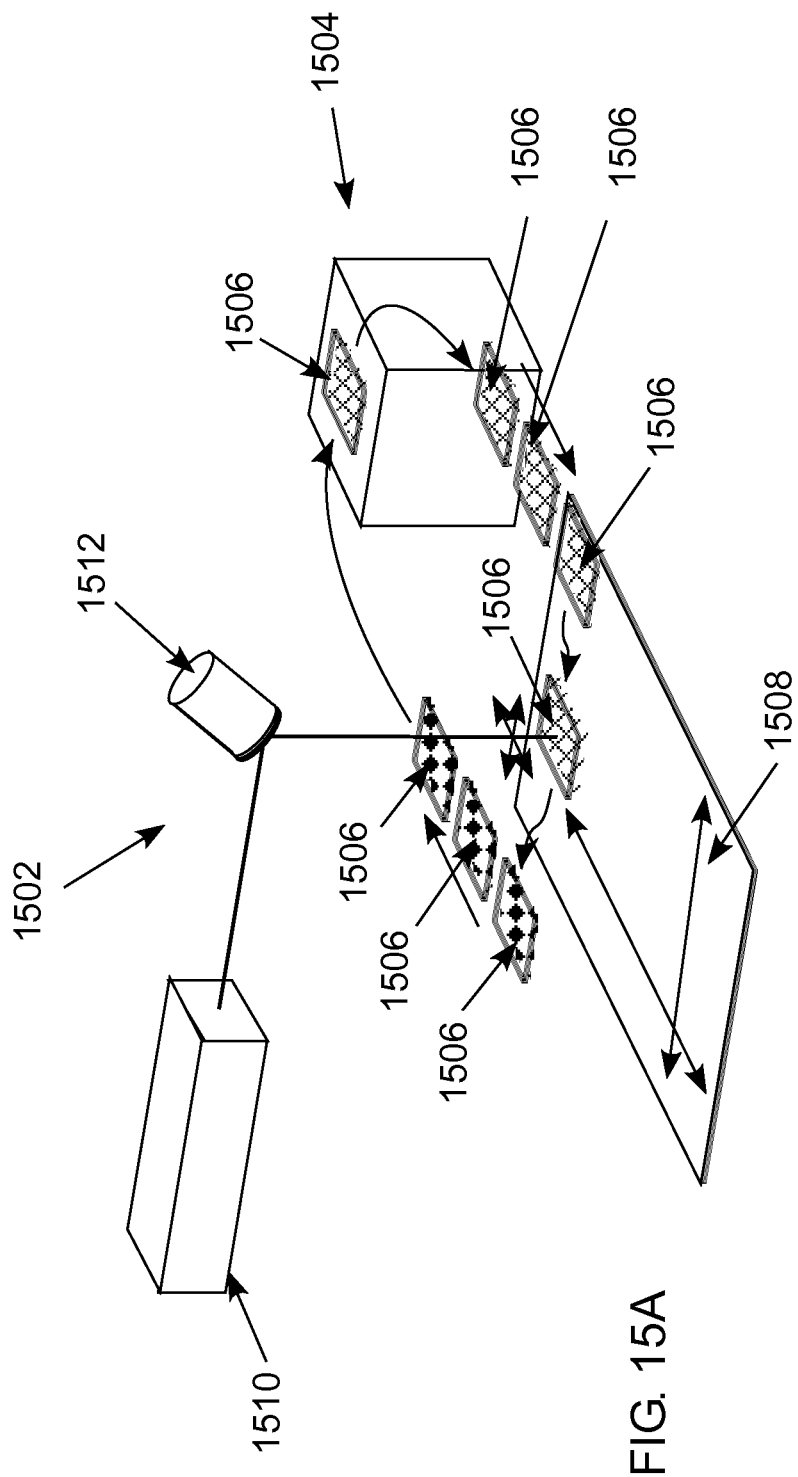
FIG. 15A illustrates an embodiment of a system including a recoating station, an exposure station and a plurality of target substrate plates.

FIG. 15A illustrates an embodiment of a LIFT system including an exposure station 1502 and a regeneration station 1504, also referred to as a recoating station. The system includes a plurality of target substrate plates 1506 that are transferred from the exposure station 1502, to the regeneration station 1504, and back to the exposure station 1502 using a conveyer belt/robot system. To pattern a workpiece 1508, a workpiece is placed on a stage and a smaller target substrate plate 1506 is positioned above it. An optical system with a pulsed laser 1510 and fast deflection of the light beam illuminates the target substrate. By movement of the long-stroke but slow stage and the small field optical scanner 1512 any point on the substrate 1506 can be placed on top of any point of the workpiece 1508 and a laser pulse can eject donor at that point. Random positioning of the mechanical stage takes around 100 milliseconds and short-range repositioning takes typically 30 milliseconds. The fast optical scanner can reposition the beam in 100 microseconds, using galvanometer mirrors, or 5 microseconds, using an acousto-optic scanner. The combination of slow and fast movements allows the laser to flash at a rate that is limited only by the optical deflection, i.e. one flash per 5 microseconds. In, embodiments, the system may include multiple beams or multiple optical trains, each with its own laser. The laser may be a diode pumped solid state laser, either on the fundamental wavelength 1.06 microns or frequency-doubled to 0.53 microns. Tripling to 0.355 micron or quadrupling to 0.266 microns is possible and lasers with other fundamental wavelengths may be used. In embodiments, a flashlamp may be used.

After the donor material on a target substrate 1506 has been used to a point where it becomes difficult to continue to write at maximum speed, a mechanical handle swaps the target substrate for a new target substrate. The used target substrate is sent for regeneration to the regeneration station 1504.

In the embodiments discussed various coating and recoating methods may be utilized at the regeneration station to coat a transparent support carrier with a donor material, either in a layer or a grid of preformed dots, as previously discussed relating to FIGS. 8A, 8B, 9A and 9B. In embodiments, the regeneration station may deposit other layers that are compatible with the LIFT process, for examples explosive layers and surface active layers, as discussed above.

In embodiments, at the regeneration station, prior to recoating a target substrate with donor material, the remaining donor material on the target substrate may be removed. Removal may be done with a scraper or a solvent, depending on the properties of the transparent carrier and of the donor material. The removed donor material may be processed and reapplied to one of the plurality of target substrates 1506 in the system. After removal of remaining donor material from a target substrate new donor material, reprocessed donor material, or a combination thereof may be applied to the target substrate in a layer or a gird of preformed dots.

As shown in FIG. 15A, an embodiment may include eight target substrates 1506 in circulation with one target substrate in the exposure station 1502 used for writing a pattern, one in regeneration station 1504, and six in queue for writing and/or regeneration. With a number of substrates in queue the operation of writing and regeneration becomes fully decoupled and both can run at their inherent speeds and even absorb minor hiccups in one process without disrupting the other process. If one of the processes have an unequal speed the target substrates will stack up waiting for the slowest process, making it faster by assuring that the slower process will never wait for material. Other embodiments may include only two or three target substrates 1506 in closed loop circulation between the exposure station 1502 used for writing a pattern and the regeneration station 1504 used for recoating the target substrates, wherein one target substrate 1506 may be exposed in a LIFT process at the exposure station 1502 simultaneously or concurrently with a second target substrate 1506 being recoated at the regeneration station 1504.

In embodiments, a depleted target substrate 1506 is moved by a robotic conveyer system to the regeneration station 1504 and to the exposure station 1502. LIFT processes frequently positions the target substrate plates with the donor material side facing downwards toward the workpiece due to gravity assisting the transfer process. However, when recoating the donor substrate plate it is sometimes beneficial for the face of the target substrate plate to be recoated to be facing upwards. This is particularly beneficially for granular, crumbling, or liquid donor material. It is easier to coat the substrates by a scraping method when the donor side of the target substrate is facing up. The material can be put on top of the substrate and pressed into a thin layer by means of a scraper without falling off in the process. After excess material has been scraped off the target substrate can be flipped by the robotic conveyer system which changes the orientation of target substrate plates when they are transferred between the exposure station and the recoating station, so that the face including or receiving the donor material is facing the correct direction for the application. FIG. 15B depicts an embodiment, similar to the embodiment shown in FIG. 15A, wherein the target substrates are sent between exposure station 1502 and regeneration stations 1504 and flipped 1514 between them with a robotic conveyer system.

According to certain aspects and advantages of the technology disclosed in FIG. 15A and FIG. 15B, unused donor material from previous process steps can be reused, or recycled, in an iterative closed loop process where a target substrate 1506 is moved by a robotic conveyer system between the regeneration station 1504 and the exposure station 1502. LIFT processes frequently positions the target substrate plates with the donor material side facing downwards toward the workpiece due to gravity assisting the transfer process. The iterative coating, or recoating, of the target substrate may then include depositing additional donor material on the outer face of the substrate and recoating a layer of donor material on the outer face of the target substrate using a mixture of the deposited additional donor material and donor material remaining on the target substrate plate after previous exposure(s) from which donor material was transferred from the target substrate.

The iterative process and devices as illustrated in FIG. 15A and FIG. 15B may include a recoating the layer of donor material by scraping, e.g. using at least one blade, scraper or squeegee, the donor material over the surface of the target substrate plate to thereby create an even layer of donor material on the surface of the target substrate plate. The scraping may be performed after additional donor material has been applied in that unused donor material from a previous laser induced forward transfer step (or exposure step) is mixed with additional donor material applied to the target substrate plate.

The iterative process and devices as illustrated in FIG. 15A and FIG. 15B may include an iterative recoating step where the donor material is recoated by using at least one of spin coating, spray coating, dip-coating and an air knife to create an even layer of donor material. These coating techniques and methods may also be combined with using at least one blade, scraper or squeegee for scraping the donor material, e.g. scraping a mixture of additional donor material and unused donor material from a previous laser induced forward transfer step (or exposure step), to thereby create an even layer of donor material on the surface of the target substrate plate.

However, for some applications in an iterative process where a target substrate 1506 is moved by a robotic conveyer system between the regeneration station 1504 and the exposure station 1502, it is sometimes beneficial for the face of the target substrate plate to be recoated to be facing upwards. This is particularly beneficially for granular, crumbling, or liquid donor material. It is also easier to coat the substrates by a scraping method when the donor side of the target substrate is facing up. The material can be put on top of the substrate and pressed into a thin layer by means of a scraper without falling off in the process. It is also easier to coat the substrates by spin coating or spray coating when the donor side of the target substrate is facing up. After recoating, the target substrate can be flipped by the robotic conveyer system which changes the orientation of target substrate plates when they are transferred between the exposure station and the recoating station, so that the face including or receiving the donor material is facing the correct direction for the application. FIG. 15B depicts an embodiment, similar to the embodiment shown in FIG. 15A, wherein the target substrates are sent between exposure station 1502 and regeneration stations 1504 and flipped 1514 between them with a robotic conveyer system.

As noted above, FIGS. 8A, 8B, 9A and 9B show methods of forming preformed dots on a transparent carrier, which may be performed at the regeneration stations disclosed herein. In embodiments, at the regeneration station the target substrate may be coated a film of donor material and in embodiments the donor substrate may include features which aid in the recoating process.

FIGS. 15C-F show embodiments of coating donor substrates with a layer of donor material which may be done at the regeneration station. In the embodiments shown in FIGS. 15C-F, at the regeneration station new donor material is added to the transparent carrier and the donor material is scraped to form a smooth film. After coating, the film is inspected for holes and other irregularities. After inspection, the target substrate is transported back toward the exposure station and queued up to be used again in another LIFT patterning process.

FIG. 15C depicts an embodiment of a donor substrate 1502 with may include a recess 1504 between two side walls 1506, wherein donor material is deposited into the recess and a scraper 1508 is guided by the tops of the sidewalls 1506 in order to achieve a desired donor material coat thickness. The sidewalls act as a guide for the scraper to control the thickness of donor material deposited on the target substrate. Specifically, to coat or recoat the target substrate shown in FIG. 15C, a donor material is deposited into the recess filling the recess above the tops of the sidewalls. A scraper is then placed against the tops of the sidewalls and pulled across the sidewalls to create a smooth surface of donor material. In embodiments, additional support for the scraper may be included, for example a pattern of ribs 1510 forming a plurality of recesses may be used, as shown in FIG. 15E. Because the ribs are in the middle of the donor material area, they prevent the area occupied by the rib and proximate to the rib from being used for LIFT. Therefore, in embodiments using target substrates with ribs, a job planning program is made aware of the excluded areas of the ribs and plans the LIFT job so these areas are not used.

FIG. 15D shows an embodiment of a donor substrate including a plurality of recesses 1504 containing donor material. As noted above the recesses may form a grid of donor material dots on the donor substrate 1502. To recoat the dots donor material is spread across the substrate filling empty recesses and a scraper 1508 is moved along the top surface of the donor substrate to remove excess donor material only leaving donor material within the dots. Using substrates with recesses has the advantage wherein the unused donor material in dots does not need to be removed prior to recoating because donor material will only fill empty recesses from which donor material was previously ejected.

FIG. 15F shows an embodiment of recoating a target substrate with a profiled scraper 1512. The profiled scraper has protrusions 1514 that touch the transparent carrier surface 1516 and maintain the height of the edges 1518 of the scraper to create an even, and well controlled, film thickness of donor material 1520. Like in FIG. 15E the areas of the target substrate which did not receive donor material 1520 due to the protrusions 1514 are excluded by the job planning program. In embodiments with a profiled scraper, the profiled scraper is moved in a mechanical precision jig or stage so the locations of the uncoated areas are accurately known by the job planning program.

FIG. 15G shows an example embodiment, similar to FIG. 15A, wherein the target substrates are batch processed. As shown, a cassette 1522 holding up to ten target substrates 1506 collects the used target substrates after they are used in the exposure station 1502 for writing a pattern on a workpiece 1508. When the cassette 1522 is full it is automatically transferred to the regeneration station 1504 and the substrates are regenerated as described above. After the substrates are regenerated the cassette is automatically moved back sent to exposure station. The advantage of a cassette embodiment is that the regeneration and the optical stations are less tightly coupled. The cassettes can be handled manually since they need to be changed less frequently, and they can be in different rooms and may be carried by hand. The disadvantage of using cassettes is that there needs to be more target substrates in circulation than in the embodiment shown in FIG. 15a. In an example one substrate may be used for one minute. After ten minutes the cassette at the exposure station is full and moves to the regeneration station. The previously regenerated cassette is then full and starts to provide substrates for writing at the exposure station. A third cassette may be moves empty to the uptake position. Every ten minutes a cassette needs to be circulated and there are twenty substrates in circulation. Each target substrate is used within ten minutes after it is regenerated. In FIG. 15A the substrates may need to be swapped every minute. FIG. 15A is shown with eight substrates in circulation, but may be used with as few as two target substrates, and would be reasonably efficient with four target substrates. The time between regeneration and use at the exposure system would be three, zero, or one minute respectively. If there is an unbalance between the speed of the writing system and the regeneration system, in embodiments, multiple regeneration stations, e.g. two or three, may be used for each writing system, or vice versa.

In the embodiments shown in FIGS. 15A and 15B, the target substrate plates are smaller than the work piece to be patterned and the donor substrate plates are moved relative to the workpiece by a motion control system. For example the workpiece may be on an x-y stage.

Figure 16B:
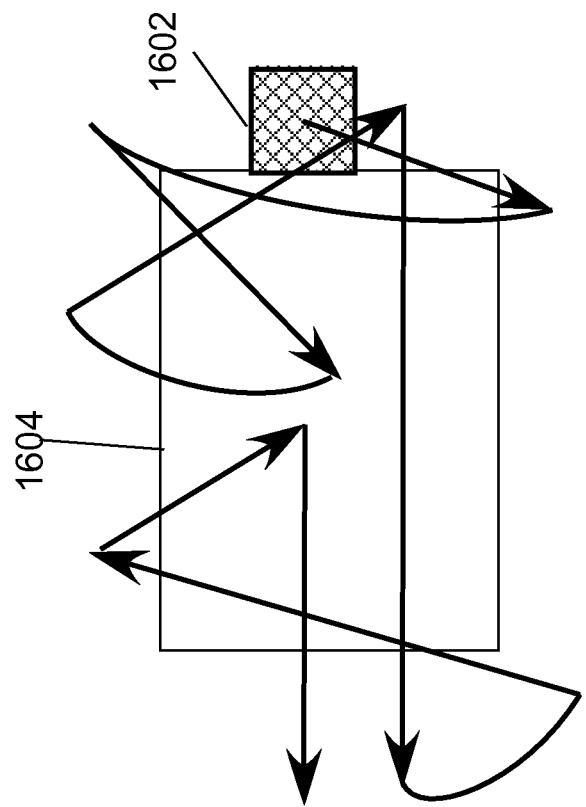
FIGS. 16A and 16B illustrate scanning paths of a target substrate plate.
Figure 16A:
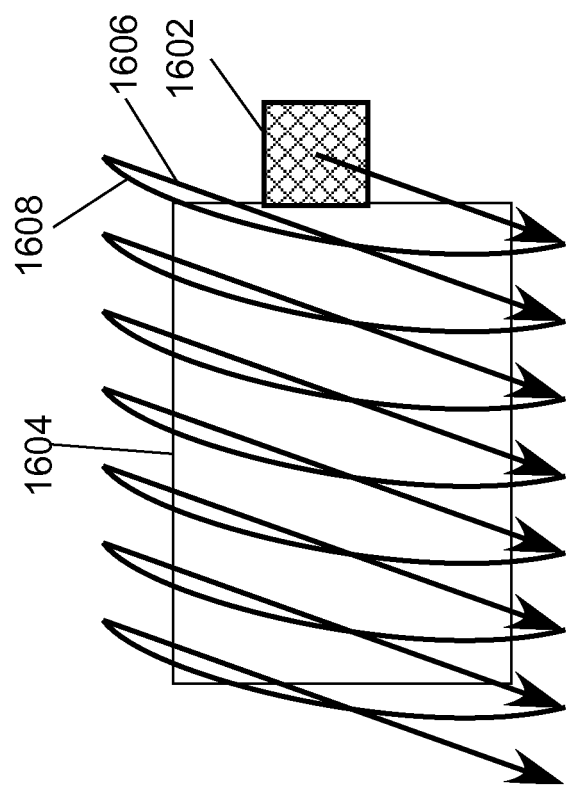

FIGS. 16A-B show an example scanning motion of a target substrate plate 1602 relative to a workpiece 1604. In the example, the strokes in the downward direction are writing strokes 1606, wherein the donor substrate is exposed with the laser causing ejection of the donor material with the LIFT process. The generally upward strokes are return strokes 1608, wherein the donor substrate is not exposed with the laser. However, in embodiments, the donor substrate may be exposed during any point in its scanning motion. Further, as discussed above, the substrate may be exposed during motion of the target substrate relative to the workpiece. However, in embodiments, the substrate may be stopped during exposure. In embodiments, the target substrate 1602 may overlap a portion of the workpiece 1604 in two or more passes allowing for multi pass writing of a portion of the workpiece. This may be beneficial for example where layers of donor material are stacked on top of one another on the same location of a workpiece, for example the "fill mode" discussed above.

In embodiments, the pattern to be deposited on the workpiece may have a low density and a repeating sweeping writing pattern as shown in FIG. 16A may be an inefficient use of time. Therefore, in embodiments, the relative movement of the target substrate 1602 and workpiece 1604 may be irregular, for example as shown in FIG. 16B, in order to pattern the workpiece in an optimal time.

FIGS. 17A-B show examples of how oblique relative scanning of the target substrate and workpiece can be accomplished. In FIG. 17A, the target substrate 1702 is oriented at an oblique angle relative to the workpiece 1704. In FIG. 17B, the target substrate 1702 is oriented parallel to the workpiece 1704 the target substrate 1702 is oriented at an angle relative to the workpiece 1704 the target substrate 1702 is oriented at an angle relative to the workpiece 1704 and the relative motion 1706 is oblique to the alignment of the target substrate and workpiece.

Figure 18C:
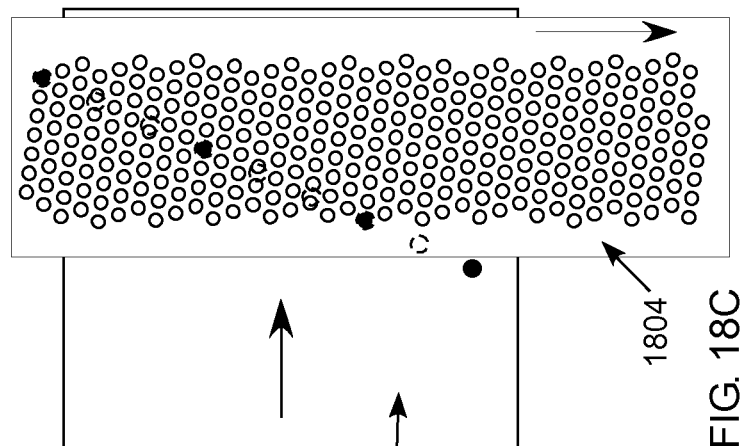
FIGS. 18A-C illustrate examples of a target substrate belt scanned at an oblique angle relative to the axes of the workpiece.
Figure 18B:
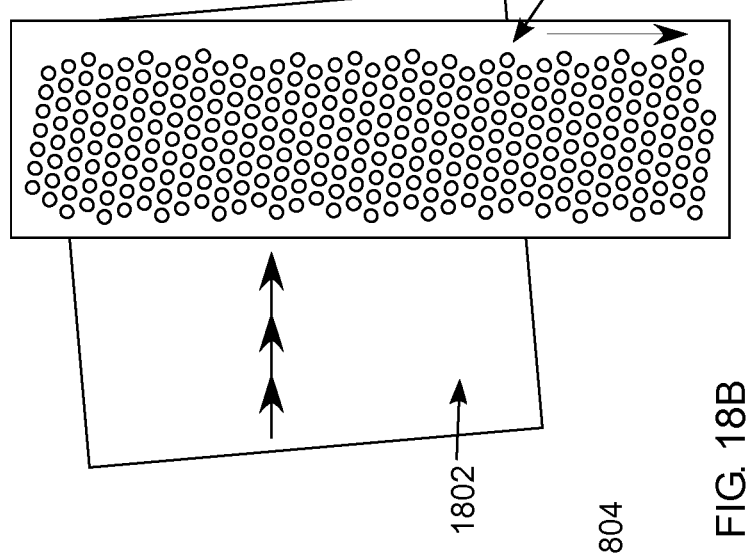
Figure 18A:
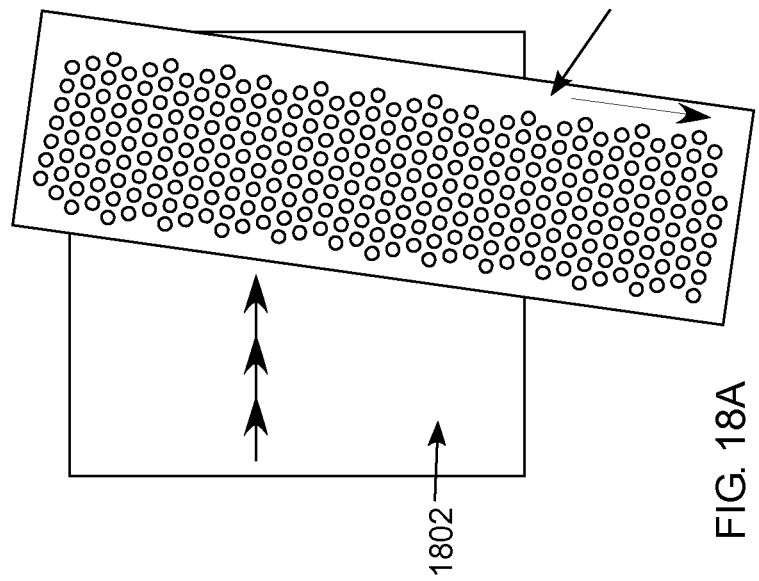

FIGS. 18A-C show embodiments of a belt target substrate being scanned at an oblique angle relative to the axes of the workpiece. In FIG. 18A the workpiece 1802, which may be a PCB or other electronic substrate, is advancing step by step. The belt target substrate 1804 scans continuously at an angle to the axes of workpiece 1802, thereby creating an oblique relative motion. In FIG. 18B the workpiece 1802 has an oblique angle to the axes of the belt target substrate 1804 movement. The direction of the step by step movement of the workpiece is not important.

FIG. 18C shows an oblique relative motion created by simultaneous scanning of both the belt target substrate 1804 and workpiece 1802. It is shown that a target position on the workpiece will coincide with a number of dots on the belt target substrate 1804. The target can be jetted with any one of these dots and they are spread across the belt. Selection of one or the other dot for jetting will affect how the dots on the belt are consumed. It is thus possible to predict a selection of dots to each target position which will consume the dots on the donor most effectively, i.e. leave the fewest dots to waste. In embodiments, the time limitations of the repositioning of the laser beam may be used to optimize, or make shorter, the time it takes to jet the entire workpiece.

In addition to reusing target substrate plates by moving the target substrate plates between a recoating station and an exposure station, high donor material utilization can also be accomplished through the uses of a continuous loop belt target substrate.

Figure 19:
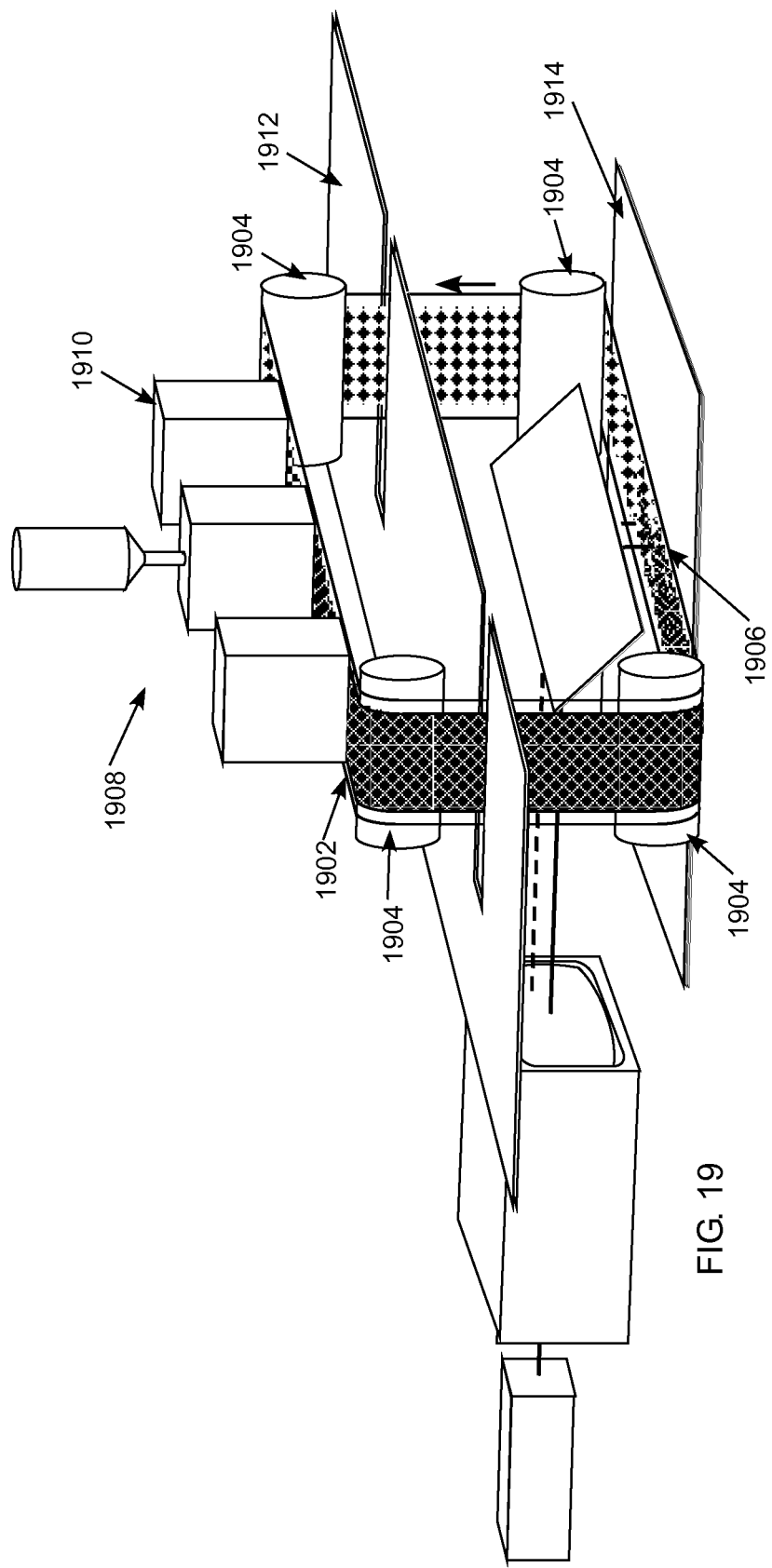
FIG. 19 illustrates an embodiment of a system including a recoating station, an exposure station and a continuous belt target substrate.

FIG. 19 shows an embodiment of a LIFT system including a regeneration station and exposure station, similar to FIG. 15A, and including a continuously loop belt target substrate 1902. The belt runs around a series of rollers/bearings 1904 through the exposure station 1906 and the recoating station 1908. The belt forms a loop and may be composed of thin glass, PC, polyimide, or silicon rubber. In embodiments, a portion of the belt is exposed in the exposure station where it might be depleted or partially depleted and then is recoated in the recoating station. The system may employ continuous motion during the LIFT process and the belt will be recoated with donor material regardless on the amount transferred to the work piece during the exposure. Unlike the target substrate plate embodiment shown in FIG. 15A, there is no time cost for recoating a portion of the belt still usable for LIFT because it is in constant motion.

In the recoating station 1908 a similar process as discussed above takes place. For example the recoating station may include a scraper 1910 which removes any unejected donor material from the portion of the belt going through the scraper. The removed donor material may be process to be reapplied to the target substrate belt. Following removal, donor material is applied to the belt, the applied donor material may be a combination of one or more of removed/process donor material and new donor material. After application, the applied donor film may be finished by scraping or drying. As shown due to the nature of a continuous belt, portion of the belt are simultaneously being scraped, applied with donor material, having the applied donor material finished and exposed with a laser to cause the LIFT process.

In this example embodiment all remaining donor material is scraped or washed away to leave the belt clean. Then new material is added and the donor material is formed into a film. The scraped-off material is sent for recycling. In embodiments, two or more layers of material, e.g. a donor and a surface-active layer or a dynamic release layer, may be coating onto the belt in the regeneration station. The layers can be dried by heat or hardened by light or heat. The time constant for these materials may be about one second which is useful for an endless belt embodiment, wherein the belt is in constant motion. In embodiments, the belt runs at 4-5 meters per minute and may be 2 meters long. In such a fast system each process step may be finished in a couple of seconds.

Further, the embodiment of the system in FIG. 19 may include a regeneration station wherein donor material is scraped up and replenishment donor material is added. The two types of material are mixed thoroughly and a new uniform film of donor on the target substrate may be created from it. This embodiment has higher utilization of material, but may not be applicable to all donor materials, such as donor that has been dried or hardened or is affected by the air.

Furthermore after recoating, the finished layer in FIG. 19 may be inspected for holes and particles after being finished and any errors can be marked as excluded area in the pre-assignment step.

Because the utilization of donor material of a portion of the belt exposed in a single pass is not critical due to the potential for high reuse of all unused donor material, the belt may run at high speeds, for example 4-5 meters per minute.

Due to the different level of "cleanliness" the exposure station and recoating station may be separated by a divider, such as a barrier floor 1912 as shown in FIG. 19, to prevent the workpiece from being contaminated by the recoating station.

As shown the outside surface of the target belt substrate 1902 is coated with donor material. In the embodiment shown, the portion of the belt where the outside surface is facing up is received by the regeneration station 1908 and the portion of the belt with the outside surface facing down is received through the exposure station 1906. As noted above, this configuration takes advantage of gravity in the coating and transfer processes. However in embodiments, other belt configuration may be employed. Further, in the embodiment shown, four rollers are included, however in embodiments other roller numbers and configuration may be used. Further, porous air bearings may be used to avoid actual contact with either face of the target substrate belt.

In the embodiment shown, the workpiece 1914 is shown as a sheet but in other embodiments may be wafers, panels, glass panes, plastic or metal sheets, roll-fed plastic or metal foil, thin glass, etc.

In embodiments including a continuous loop belt target substrates, the pulsed laser is vector-addressed, i.e. it can reach points in the field in an arbitrary order. There may be a combination of a fast small field scanner, e.g. a small galvanometer or an acousto-optic deflector, and a slower large-field galvanometer to get fast point to point movement in a large field. There may also be an SLM, either coherent SLM or a DMD micromirror chip, for impressing a shape on the beam before it is deflected. In the example embodiment of FIG. 19 the laser beam is injected into the endless belt loop via a mirror. As described elsewhere in this disclosure the a priori known features on the workpiece to be coated with donor and the relative movement of the belt and the workpiece allow for pre-assignment of each feature on the workpiece to a point on the belt where the donor material will be ejected. There laser is able to hit a point on the belt target substrate when the point on the belt target substrate is closest to the corresponding site on the workpiece. When assigning points and features, a job planning program takes into account the relative motions of the donor and the workpiece, as well as complications like the timing limitations of the laser and optical deflection and excluded areas on the donor, which cannot be used for LIFT. By moving the target substrate obliquely relative to the workpiece the Manhattan character of most patterns on workpieces can be averaged out and more efficient use of the donor area can be made. The angle between the workpiece and the donor can be tuned to make the use of the donor area better.

In embodiments, a pre-analysis of the donor efficiency is conducted by the job planning program before points on the donor are pre-assigned to features on the workpiece. If this analysis shows unsatisfactory efficiency a different angle may be used. For example, if there is a Manhattan geometry an angle such as 5 degrees may be selected. A pre-analysis of the pattern is done based the selected angle. Based on the selected angle and the assumed movement during writing, the points on the target substrate to be jetted are pre-determined. In embodiments, to speed up the analysis a sample of only some of the points in a pattern may be used, e.g. 1000 shots. If the shots can be predetermined to reasonably efficiently deplete the donor on the donor sheet the selected angle is used to orient the pattern. If the selected angle is predetermined not to efficiently deplete donor material then the angle is adjusted by a small amount, for example 1 degree, and the analysis is run again until a satisfactory angle is found. If all angles are determined to be unsatisfactory then the most efficient angle is selected. Further, in embodiments orientation angle may be calculated for a Manhattan geometry based at least in part on projection of the donor material requirements for at least a segment of the pattern on the workpiece onto a base line.

In regard to the continuous motion embodiments, including regeneration stations, all other elements described in this application, e.g. oblique grid, rotated scanning directions, pre-assignment of dots to positions on the workpiece multiple passes may be implemented in these embodiments.

Figure 20:
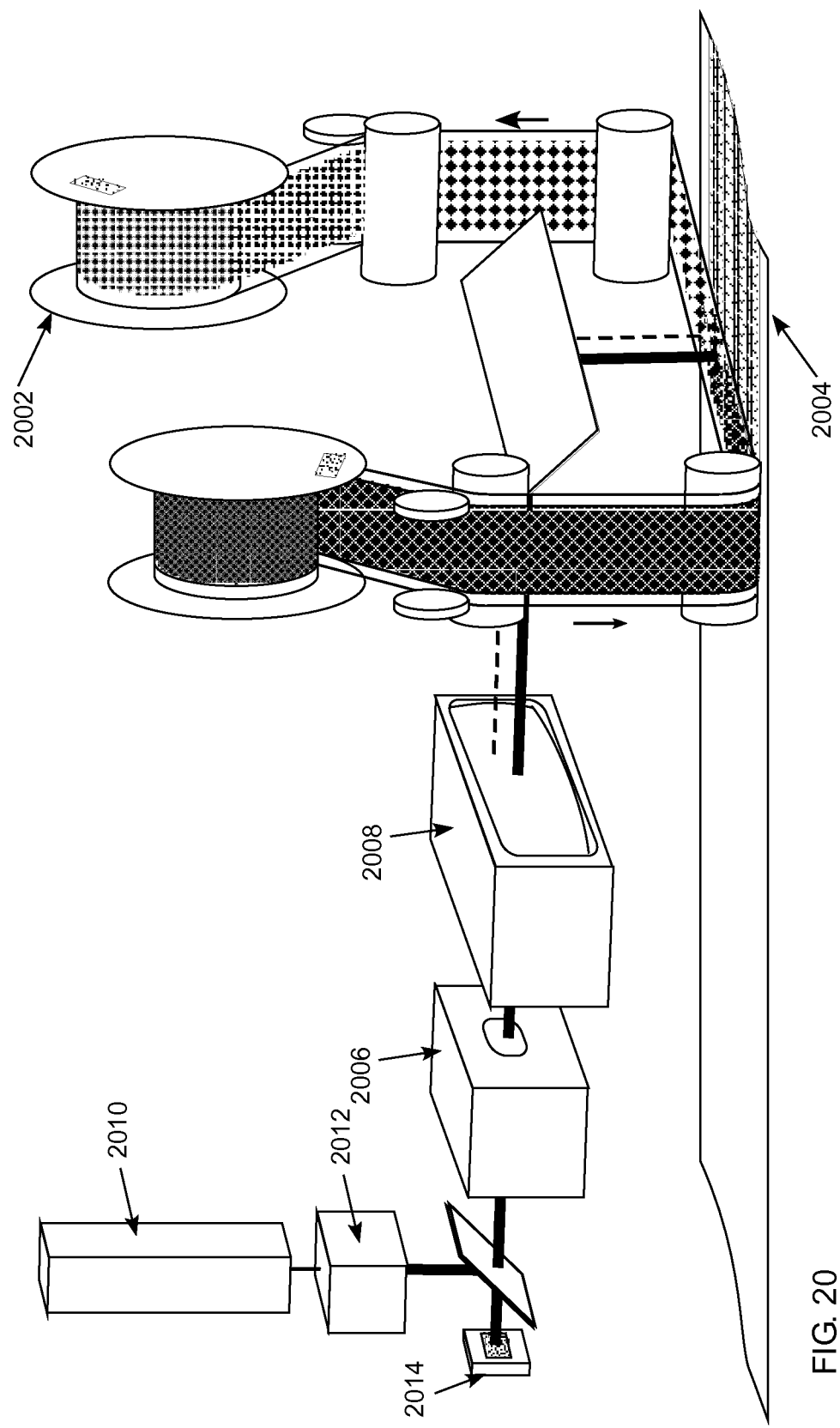
FIG. 20 illustrates an embodiment of a system including an exposure station and a reel to reel pre-coated target substrate.

FIG. 20 shows an example embodiment where the target substrate is fed as rolls of tape 2002 with a film of donor material. The used tape moves to a take-up roll and may be sent away for material regeneration or disposed of. The rolls are shown with machine-readable tags which may connect to a database where data about the roll is stored such as supplier, article number, individual ID, material composition, thickness, suitable pulse energy, how much of the tape is used, etc. The example system is shown to write on a foil 2004 and it has a fast small-field optical scanner 2006, which can be mechanical (piezomirrors with high bandwidth) or optical (e.g. acoustooptical, electrooptical), and a large-field optical scanner 2008 which has a field large enough to scan across the workpiece or a foil.

The laser 2010 has an illuminator 2012 which spreads the beam over an area illuminating a beam shaper 2014. The beam is shaped by an aperture by moving rulers or by an SLM, preferably a coherent spatial light modulator such as an LCD or coherent micromechanical mirror device, and sent by the large field scanner to an area on the workpiece 2004. The large-field scanner is relatively slow compared to the other components and sets the beam to an area on the workpiece, where it is quickly moved from point to point by the fast small-field scanner and the shape of the beam is either stationary or dynamically changed by the rulers or SLM. The tape has handling areas at the sides and the figure shows drive rollers using these areas. There can also be alignment information, e.g. mechanical indentations or cinema-style holes for alignment and traction.

FIG. 21A shows an optical principle of another example embodiment. It has a small field piezo scanner 2102 with high bandwidth and a large-angle scanner 2104 with less bandwidth, sending the beam to a wide-field lens 2106. The wide field lens 2106 which may have a diameter of 500 mm or more sets the beam at one place on the workpiece/acceptor 2108. The target substrate 2110 with donor material extends across all or a substantial part of the large field. Once the large-field scanner has set the beam to an area on the workpiece the fast small-field scanner can move it quickly in x and y within a field which may be 30×30 mm.

FIG. 21B shows how the Gaussian spot can be reshaped by a phase filter as shown in FIG. 21A, so that it has a more flat cross section and steeper edges. FIG. 21B shows the Gaussian spot (dashed), a spot after a phase filter has been inserted in the beam path (thin solid line) and the latter spot shrunk back to the size of the Gaussian spot by means of a higher NA lens (thick solid line). The shrunk beam has the same size as the Gaussian beam but has a more flat energy profile and steeper edges, improving the process latitude.

Figure 22:
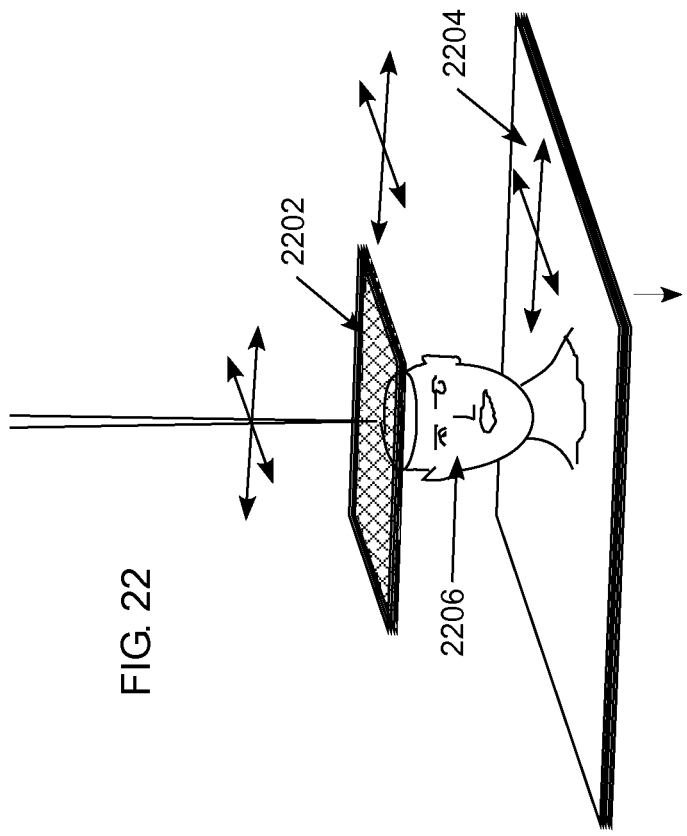
FIG. 22 illustrates a LIFT process for 3D printing.

FIG. 22 shows a conceptual 3D printer using the principles laid out in this application for fast laser jetting. The flexible choices of transferred materials and the small shots possible makes laser jetting a compelling option for 3D printing of small or delicate parts. The embodiment includes a target substrate 2202, a stage 2204, and a 3D printed model 2206.

Figure 23:
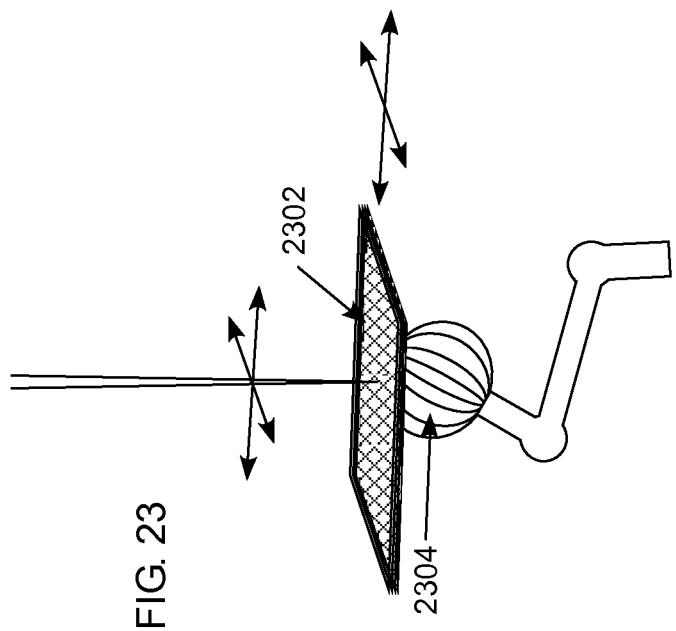
FIG. 23 illustrates patterning the surface of a 3D object by LIFT.

FIG. 23 shows an embodiment of a 3D printer applied to patterning or coating of 3D objects. The embodiment includes a target substrate 2302 which is used to transfer donor material onto a 3-dimensional workpiece 2304.

FIG. 24B depicts an embodiment of a system architecture similar to FIG. 21A with a fast small-field 2402 and a slower large-field scanner 2404. The advantage is that the system is able to quickly hit a large number of points within the small field, then reposition the small field within a large field to find a new large number of points to work on. The fast scanner can be an acousto-optic scanner which can do random access addressing of 100 000 to 200 000 points within a 1000×1000 point field. The large field scanner is preferably a galvanometer scanner which may move the small field about 1000 times per second. In embodiments, multiple beams may be use and/or multiple lasers for more flashes per second. FIG. 21B shows that the beam can be tweaked to have a more uniform disc shape for more uniform dots.

In FIG. 24B an SLM 2406 is included. The SLM can be a coherent MEMS SLM, or an LCD SLM as is manufactured by HoloOr (Berlin, Germany) and other companies. In embodiments, the SLM may also be a non-coherent micromirror device as the DMD chip from Texas Instruments. LIFT with structured light from a DMD mirror has recently been described by Raymond Auyeung et al. in Optics Express, Vol. 23, Issue 1, pp. 422-430 (2015). They describe using the demagnified image from a DMD to transfer shapes. Comparing possible SLMs, the DMD has a useful update rate of about 30 kHz, higher than both the coherent MEMS SLM developed by the assignee and the LCD SLMs that are commercially available. In the example embodiment in FIG. 24B the light is stricter near the laser source 2408 and the shape that is impressed on the light beam follows it through the scanning optics. Therefore the SLM can make a shape and change it 30 000 times per second and the scanning system can make 200 000 prints of the shape on the workpiece 2410. FIG. 24A shows in conceptual form a writer with shaped light and fast scanner for LIFT. The writer includes a laser 2412, a beam shaper 2414 (e.g. SLM), a second beam shaper 2416, a target substrate movement stage 2418, and a workpiece movement stage 2420, all attaches to a digital controller 2422. The Digital controller accepts a pattern to be produced and controls the stage with the acceptor and the stage with the donor, the optical scanner, the beam shaper, and the emission of laser pulses. Note that the addition of the SLM makes the system much faster since complicated patterns can be built from shapes, not dots.

The systems in FIGS. 24A and 24B can be combined with several other aspect of the technology disclosed herein. The DMD does not withstand high energy pulses, but the pulse energy can be magnified by the chemically amplified explosive layer. The writing can be combined with continuously fed donor materials or by non-interrupted circulation of donor substrates.

Figure 24C:
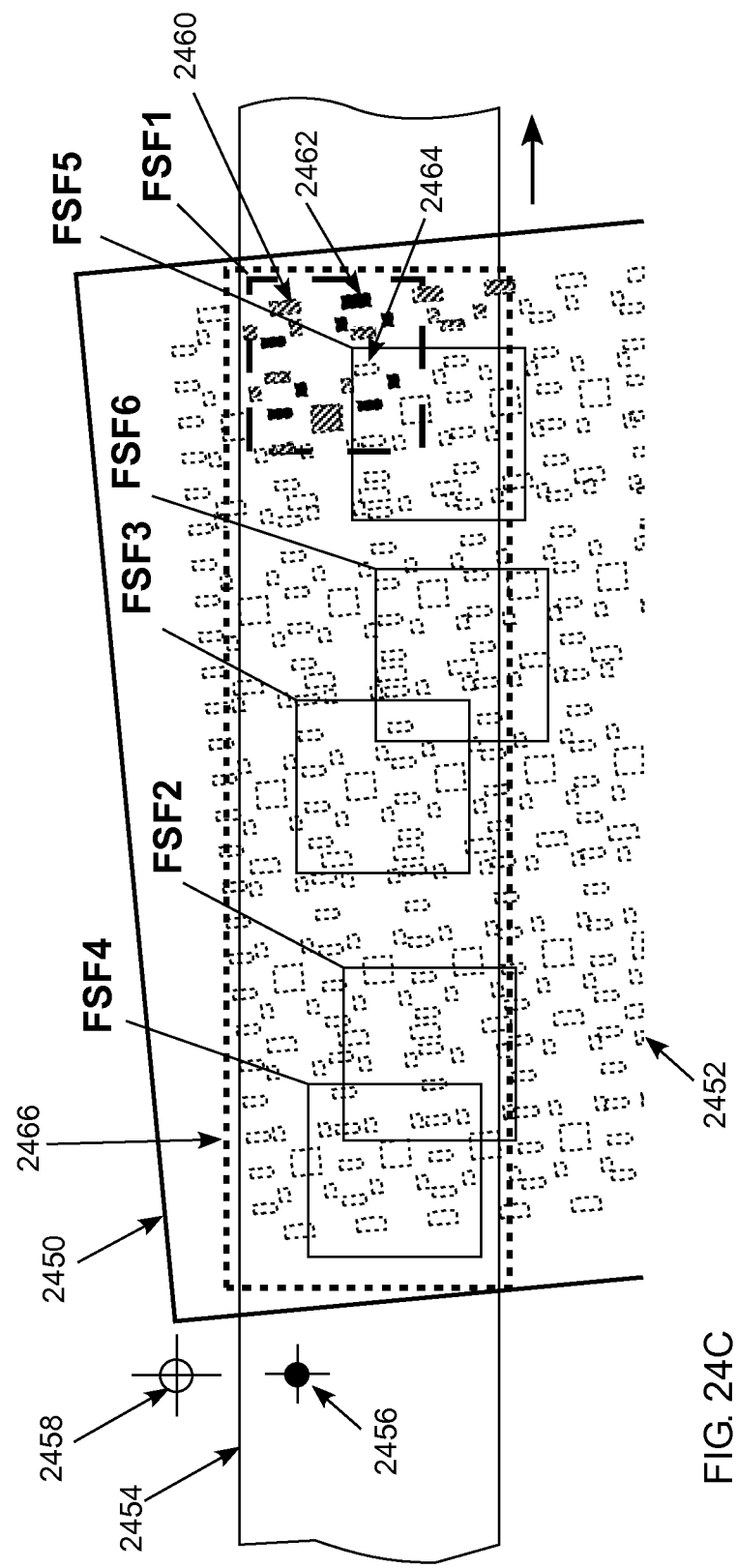
FIGS. 24C, 24D and 24E show more in detail of how the pre-assignment works in an example embodiment.

FIGS. 24 C-E show more in detail of how the pre-assignment works in an example embodiment. In FIG. 24C the workpiece 2450, which can be a PCB, is patterned by LIFT. The dashed features 2452 are the locations where donor material is to be printed. The pattern of features 2452 is described in a digital pattern description which is input to the digital controller. Since there are repetitive patterns along the axes of the workpiece it is beneficial to use an oblique angle. The donor comes from a tape 2454 which comes from a roll of prefabricated donor tape or may be the endless loop shown and described above. There is a large optical field 2466 covering the entire width of the workpiece 2450. This field is addressed by a galvanometric x-y scanner which has a time to accurately settle to a new position of 1 millisecond. There is also a fast acousto-optic x-y scanner which can deflect the beam within a small field. Six such small fast scanner fields FSF1-6 are shown each with a different setting of the galvanometer. Within a fast field the beam can be repositioned up to 200 000 times per second. In FIG. 24C the galvanometer is set to the FSF1. Some of the features within FSF1 are already written, the hatched ones 2460. The fast scanner positions the beam on the features that have not been written before, the black features 2462, and write them quickly. It has to position the beam on the feature 2462, form the shape by the SLM and then wait until there is useful donor above a feature and pulse the laser. Then the next feature will be written. FIG. 24C is written with features with a shape which is written with an SLM. The principle is the same without the SLM but the pattern is divided into round patches instead of shapes. Since each feature needs to be defied by several round patches a system with an SLM is much faster. When writing the field FSF1 the digital controller leaves some features 2464 which will be written in a later field FSFS. When all planned features of FSF1 are written the galvanometer moves the field to FSF2.

Figure 24D:
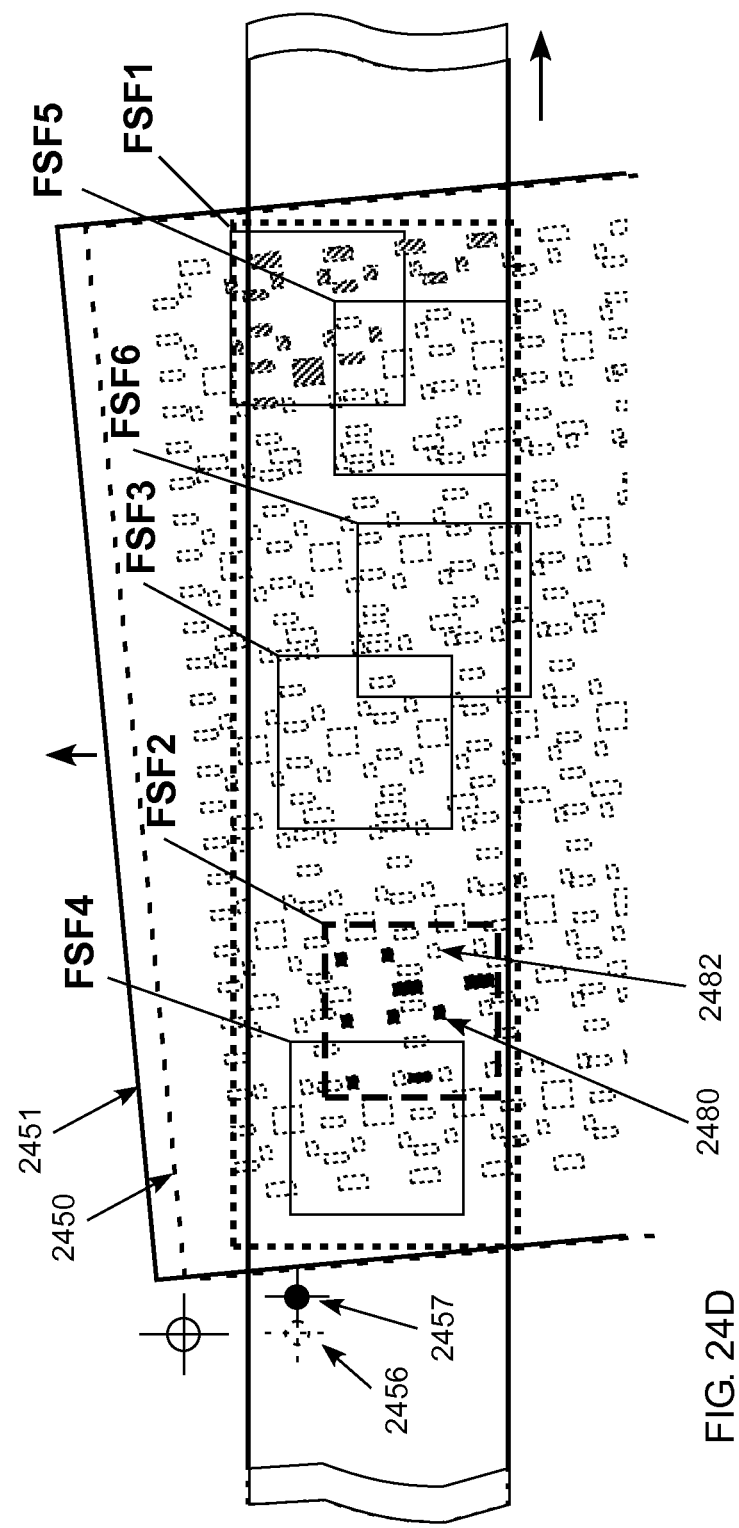

FIG. 24D shows when the galvanometer has repositioned the beam to FSF2. The workpiece and tape are moving, in this example the workpiece has moved from 2450 to 2451 and the tape from 2456 to 2457. The black features 2480 are written. Some of them have the same shape and can be written with the same shape on the SLM, i.e. at the speed determined by the fast scanner, 200 000 per second, instead of the SLM's 30000 per second. Other features 2482 are left unexposed because in the planning they are assigned to a different field written later.

Figure 24E:
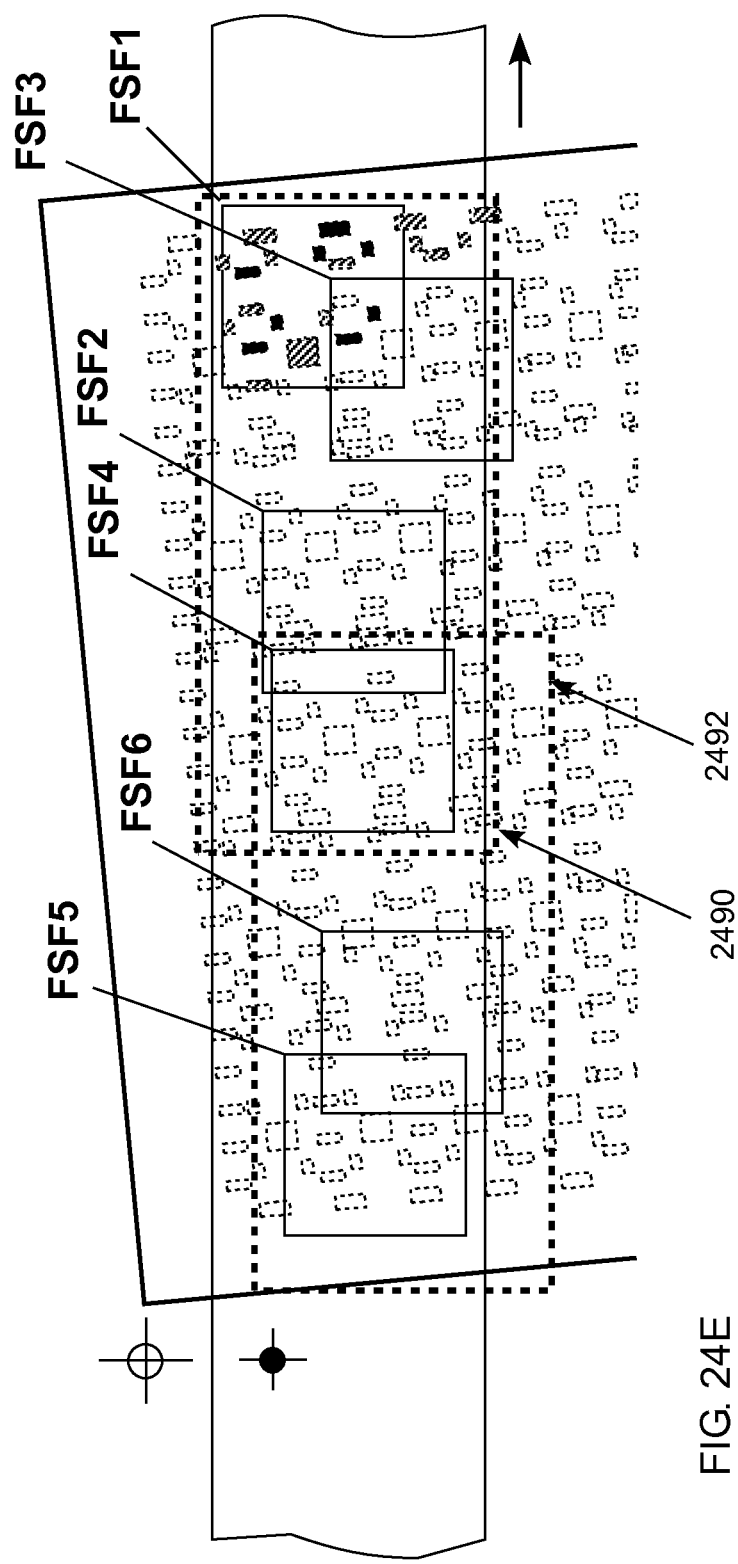

In FIG. 24E the workpiece is wider than the large optical field 2490. Therefore the mechanical stage need to reposition the writing system or the workpiece so the field falls in a new position 2492 after 2490 has been finished. The writing sequence has to be planned well in advanced for the system to write at a high average speed without waiting too long for points to coincide. Likewise the number of fields should be small and the area utilization of the donor on the tape must be high. The timing of the continuous movement and the time constraints on the laser and optical scanners are taken into account. This is an optimization problem similar to the Travelling Salesman's Problem, but an optimal solution need not be found, only one solution which gives good enough throughput and reasonable utilization of the donor material. The parameters of the optimization can be tuned for speed or material efficiency, depending on the situation and cost of the donor material.

The technology disclosed includes a method of depositing material in a pattern on a workpiece by transfer of donor material by laser induced forward transfer. The method includes providing a first and second target substrate plats including laser transparent supports and initial coatings including donor material, at an exposure station, pulsing a laser beam through the first target substrate plate causing portions of donor material to be transferred from the first target substrate plate to form a portion of the pattern on the workpiece. The method further includes, concurrently with pulsing the laser beam through the first target substrate plate, at a recoating station, recoating with donor material the second target substrate plate, wherein, prior to recoating, the second target substrate plate includes portions from which donor material was previously transferred, causing the recoated second target substrate plate to be moved from the recoating station to the exposure station; and at the exposure station, pulsing the laser beam through the second target substrate plate causing portions of donor material to be transferred from the second target substrate plate to form a portion of the pattern on the workpiece or a second workpiece.

In embodiments, the first and second target substrate plates each include an outer face including the donor material, wherein at the recoating station the outer faces face upwards relative to gravity and are recoated with donor material; and wherein at the exposure station the outer faces face downwards relative to gravity. Also in embodiments, the coating includes removing the initial coating of donor material from the second target substrate plate, and depositing a layer of donor material on the second target substrate plate after removing the initial coating. Further in embodiments the recoating includes removing the initial coating of donor material from the second target substrate plate, and depositing a grid pattern of discrete separated dots of donor material on the second target substrate plate after removing the initial coating. Wherein pulsing the laser beam through the second target substrate plate includes causing the discrete separated dots to be transferred from the target substrate to form the corresponding pattern on the workpiece. In embodiments, the recoating includes filling in trenches from which donor material was previously transferred, wherein the trenches form a grid pattern on the second target substrate plate. In embodiments, the recoating includes localized recoating of portions of the second target substrate plate where donor material has been transferred from plate by the laser beam pulse. In embodiments, the recoating includes jet printing of donor material onto the second target substrate plate. In embodiments, said first and second target substrate plates are moved back and forth between the recoating station and the exposure station in an iterative closed loop process in order to be repeatedly recoated with donor material and then sequentially exposed to said laser beam. Also in embodiments, the method includes the use of at least three target substrate plates, including the first and second target substrate plates, wherein the at least three target substrate plates are sequentially moved back and forth between the recoating station and the exposure station in an iterative closed loop process in order to be repeatedly recoated and then sequentially exposed to said laser beam.

The technology further includes a device for depositing material in a pattern on workpieces by transfer of donor material by laser induced forward transfer, including, target substrate plates including laser transparent supports and initial coatings including donor material, an exposure station, including a laser, configured to receive the target substrate plates, and pulse a laser beam through each of the target substrate plates to cause portions of the donor material to be transferred from the target substrate plates to the workpieces, a recoating station configured to receive the target substrate plates and recoat the target substrate plates, and a motion control system configured to move the target substrate plates from the exposure station to the recoating station. In embodiments, the target substrate plates include outer faces including the donor material, and wherein the motion control system positions the outer face oriented upwards relative to gravity at the recoating station and positions the outer face oriented downwards relative to gravity at the exposure system.

In embodiments, the target substrate plates include two target substrate plates configured to be reused in a continuous process wherein each of the two target substrate plates are repeatedly recoated and then sequentially exposed to said laser beam by being moved back and forth between the recoating station and the exposure station in an iterative closed loop process.

In embodiments, the target substrate plates comprises at least three target substrate plates configured to be reused in a continuous process wherein each one of the at least three target substrate plates are repeatedly recoated and then sequentially exposed to said laser beam by being moved back and forth between the recoating station and the exposure station in an iterative closed loop process.

The technology further includes a method of efficiently transferring donor material by laser induced forward transfer from a target substrate to the workpiece, including providing one surface of a target substrate with a pattern of discrete separated dots of donor material, orienting the surface with the pattern of discrete separated dots of donor material to face a workpiece, and pulsing a laser beam through the target substrate, causing the discrete separated dots to be transferred from the target substrate to form a pattern on the workpiece.

Embodiments include the pattern including a Manhattan geometry, and the method further including causing the target substrate to move relative to the workpiece in a relative direction of motion, and orienting the pattern on the workpiece askew to the relative direction of motion, wherein the askew orientation angle more evenly distributes donor material requirements, imposed by the Manhattan geometry pattern, across the target substrate in a direction perpendicular to the relative direction of movement.

Embodiments, include calculating for the Manhattan geometry an askew orientation angle based at least in part on projection of the donor material requirements for at least a segment of the pattern on the workpiece onto a base line.

Embodiments include the pattern of discrete separated dots including dots of different shapes and sizes. Embodiments include the pattern of discrete separated dots including portions of donor material with thicknesses that vary by at least 20 percent.

Embodiments include pulsing a laser beam through the target substrate including focusing the laser beam on an area of the target substrate larger than the discrete separated dot to be ejected.

Embodiments include the pattern of discrete separated dots being formed within recesses in the surface of the target substrate.

Embodiments include, the pattern of discrete separated dots including a first dot having a first thicknesses and a second dot having a second thickness different than the first thickness.

Embodiments further include the pattern of the discrete separated dots being a hexagonal pattern.

The terms and expressions employed herein are used as terms and expressions of description and not of limitation, and there is no intention, in the use of such terms and expressions, of excluding any equivalents of the features shown and described or portions thereof. In addition, having described certain implementations of the technology disclosed, it will be apparent to those of ordinary skill in the art that other implementations incorporating the concepts disclosed herein can be used without departing from the spirit and scope of the technology disclosed. Accordingly, the described implementations are to be considered in all respects as only illustrative and not restrictive.

What is claimed is:

1. A method of transferring donor material by laser induced forward transfer from a target substrate to a workpiece, including:
   providing one surface of a target substrate with a pattern of discrete separated dots of donor material;
   orienting the surface with the pattern of discrete separated dots of donor material to face a workpiece;
   pulsing a laser beam through the target substrate, causing the discrete separated dots to be transferred from the target substrate to form a pattern on the workpiece in a Manhattan geometry pattern;
   causing the target substrate to move relative to the workpiece in a relative direction of motion; and
   orienting the pattern on the workpiece askew to the relative direction of motion, wherein the askew orientation angle more evenly distributes donor material requirements, imposed by the Manhattan geometry pattern, across the target substrate in a direction perpendicular to the relative direction of movement.

2. The method of claim 1, further including calculating for the Manhattan geometry the askew orientation angle based at least in part on projection of the donor material requirements for at least a segment of the pattern on the workpiece onto a base line.

3. The method of claim 1, wherein the pattern of discrete separated dots includes dots of different sizes.

4. The method of claim 2, wherein the pattern of discrete separated dots includes dots of different shapes.

5. The method of claim 1, wherein the pattern of discrete separated dots includes a dot including portions of donor material with thicknesses that vary by at least 20 percent.

6. The method of claim 1, wherein the pulsing the laser beam through the target substrate includes focusing the laser beam on an area of the target substrate larger than the discrete separated dot to be ejected.

7. The method of claim 1, wherein the pattern of discrete separated dots are formed within recesses in the surface of the target substrate.

8. The method of claim 1, wherein the pattern of discrete separated dots includes a first dot having a first thickness and a second dot having a second thickness different than the first thickness.

9. The method of claim 1, wherein the pattern of the discrete separated dots is a hexagonal pattern.

10. The method of claim 2, wherein the pattern of discrete separated dots includes a dot including portions of donor material with thicknesses that vary by at least 20 percent.

11. The method of claim 2, wherein the pulsing the laser beam through the target substrate includes focusing the laser beam on an area of the target substrate larger than the discrete separated dot to be ejected.

12. The method of claim 2, wherein the pattern of discrete separated dots are formed within recesses in the surface of the target substrate.

13. The method of claim 2, wherein the pattern of discrete separated dots includes a first dot having a first thickness and a second dot having a second thickness different than the first thickness.

14. The method of claim 3, wherein the pulsing the laser beam through the target substrate includes focusing the laser beam on an area of the target substrate larger than the discrete separated dot to be ejected.

15. The method of claim 3, wherein the pattern of discrete separated dots are formed within recesses in the surface of the target substrate.

16. The method of claim 3, wherein the pattern of discrete separated dots includes a first dot having a first thickness and a second dot having a second thickness different than the first thickness.

17. The method of claim 4, wherein the pattern of discrete separated dots are formed within recesses in the surface of the target substrate.

18. The method of claim 4, wherein the pattern of discrete separated dots includes a first dot having a first thickness and a second dot having a second thickness different than the first thickness.

19. The method of claim 5, wherein the pattern of discrete separated dots includes a first dot having a first thickness and a second dot having a second thickness different than the first thickness.

* * * * *